(12) United States Patent
Nielsen et al.

(10) Patent No.: US 10,647,851 B2
(45) Date of Patent: May 12, 2020

(54) 1,2,5,6-NAPHTHALENEDIIMIDE CO-POLYMER

(71) Applicant: PHILLIPS 66 COMPANY, Houston, TX (US)

(72) Inventors: Laura Nielsen, Bartlesville, OK (US); Kathy Woody, Bartlesville, OK (US); Taeshik Earmme, Seoul (KR)

(73) Assignee: PHILLIPS 66 COMPANY, Houston, TX (US)

(*) Notice: Subject to any disclaimer, the term of this patent is extended or adjusted under 35 U.S.C. 154(b) by 17 days.

(21) Appl. No.: 16/038,316

(22) Filed: Jul. 18, 2018

(65) Prior Publication Data
US 2019/0031878 A1   Jan. 31, 2019

Related U.S. Application Data

(60) Provisional application No. 62/538,405, filed on Jul. 28, 2017.

(51) Int. Cl.
| | | |
|---|---|---|
| *H01B 1/12* | (2006.01) | |
| *C08L 79/04* | (2006.01) | |
| *C08G 61/12* | (2006.01) | |

(52) U.S. Cl.
CPC ............ *C08L 79/04* (2013.01); *C08G 61/126* (2013.01); *H01B 1/12* (2013.01);
(Continued)

(58) Field of Classification Search
CPC ...... C08G 2261/124; C08G 2261/1412; C08G 2261/149; C08G 2261/3223;
(Continued)

(56) References Cited

U.S. PATENT DOCUMENTS

| | | |
|---|---|---|
| 9,502,473 B2 | 11/2016 | Lee et al. |
| 2014/0021448 A1 | 1/2014 | Polander et al. |

(Continued)

FOREIGN PATENT DOCUMENTS

JP          2015153780 A  *  8/2015

OTHER PUBLICATIONS

Zhang, Z. et al., "Incorporation of benzothiadiazole into the backbone of 1,2,5,6-naphthalenediimide based copolymers, enabling much improved film crystallinity and charge carrier mobility," Polym. Chem., 2016, 7, 573 (Year: 2016).*

(Continued)

*Primary Examiner* — Mark Kopec
*Assistant Examiner* — Jaison P Thomas
(74) *Attorney, Agent, or Firm* — Phillips 66 Company

(57) ABSTRACT

A copolymer comprising a repeat unit A, wherein repeat unit A comprises (Continued)

and at least one repeat unit B, wherein repeat unit B comprises an aryl group.

12 Claims, 10 Drawing Sheets

(52) U.S. Cl.
CPC . *C08G 2261/124* (2013.01); *C08G 2261/149* (2013.01); *C08G 2261/1412* (2013.01); *C08G 2261/3223* (2013.01); *C08G 2261/3243* (2013.01); *C08G 2261/344* (2013.01); *C08G 2261/414* (2013.01); *C08G 2261/91* (2013.01); *C08L 2203/204* (2013.01)

(58) Field of Classification Search
CPC ...... C08G 2261/3243; C08G 2261/344; C08G 2261/414; C08G 2261/91; C08G 61/126; C08L 2203/204; C08L 79/04; H01B 1/12
See application file for complete search history.

(56) References Cited

U.S. PATENT DOCUMENTS

2015/0333264 A1  11/2015  Mishra et al.
2018/0040825 A1*  2/2018  Kobilka ............... C08G 61/126

OTHER PUBLICATIONS

Zhang, S. et al. "Polymer Electron Acceptors Based on Iso-Naphthalene Diimide Unit with High LUMO Levels," Macromol. Chem. Phys. 2017, 218, 1600606 (Year: 2017).*
Zuojia, L. et al., "Large band-gap copolymers based on a 1,2,5,6-naphthalenediimide unit for polymer solar cells with high open circuit voltages and power conversion efficiencies," J. Mater. Chem. A, 2016, 4, 7372 (Year: 2016).*
PCT Notification of Transmittal of the International Search Report and the Written Opinion of the International Searching Authority, or the Declaration, International Application No. PCT/US2018/042711, International Filing Date Jul. 18, 2018, 17 pages.
PUBCHEM, Open Chemistry Database, N,N'-Di(2-octyldodecyl)-37-dibromonaphthalene-1,2,:5,6-bis (dicarbimide) Substance Record for SID 275369910, Dec. 24, 2015, 6 pages.
Shan-ci Chen, Qikai Zhang, Qingdong Zheng, Changquan Tang and Can Zhong Lu, "Angular-Shaped Naphthalene Tetracarboxylic Diimides for N-Channel Organic Transistor Semiconductors", ChemComm Communication, 2012, vol. 48, pp. 1254-1256.
Zheng Zhao, Fengjiao Zhang, Xu Zhyang, Xiaodi Yang, Hongxiang Li, Xike Gao, Chong-an Di, and Daoben Zhu, 1,2,5,6-Naphthalenediimide Based Donor-Acceptor Copolymers Designed from Isomer Chemistry for Organic Semiconducting Materials, Macromolecules Article, 2013, vol. 46, pp. 7705-7714.

* cited by examiner

1,2,5,6-NAPHTHALENEDIIMIDE CO-POLYMER

CROSS-REFERENCE TO RELATED APPLICATIONS

This application is a non-provisional application which claims the benefit of and priority to U.S. Provisional Application Ser. No. 62/538,405 filed Jul. 28, 2017, entitled "A 1,2,5,6-Naphthalenediimide Co-Polymer", which is hereby incorporated by reference in its entirety.

STATEMENT REGARDING FEDERALLY SPONSORED RESEARCH OR DEVELOPMENT

None.

FIELD OF THE INVENTION

This invention relates to high performance wide-bandgap polymers for organic photovoltaics.

BACKGROUND OF THE INVENTION

Solar energy using photovoltaics requires active semiconducting materials to convert light into electricity. Currently, solar cells based on silicon are the dominating technology due to their high-power conversion efficiency. Recently, solar cells based on organic materials showed interesting features, especially on the potential of low cost in materials and processing.

Organic photovoltaic cells have many potential advantages when compared to traditional silicon-based devices. Organic photovoltaic cells are light weight, economical in the materials used, and can be deposited on low cost substrates, such as flexible plastic foils. However, organic photovoltaic devices typically have relatively low power conversion efficiency (the ratio of incident photons to energy generated). This is, in part, thought to be due to the morphology of the active layer. The charge carriers generated must migrate to their respective electrodes before recombination or quenching occurs. The diffusion length of an exciton is typically much less than the optical absorption length, requiring a tradeoff between using a thick, and therefore resistive, cell with multiple or highly folded interfaces, or a thin cell with a low optical absorption efficiency.

Angular-shaped 1,2,5,6-naphthalene tetracarboxylic diimide (NDI) monomers have demonstrated high conductivity in other organic electronic applications. There exists a need NDI based polymers with low polymer bandgaps.

BRIEF SUMMARY OF THE DISCLOSURE

A copolymer comprising a repeat unit A, wherein repeat unit A comprises

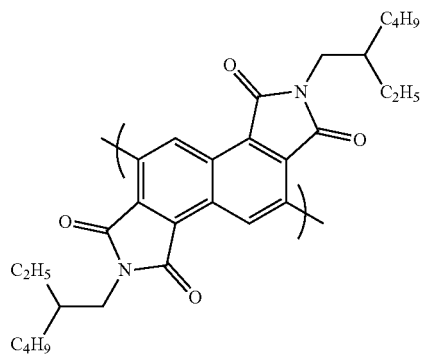

and at least one repeat unit B, wherein repeat unit B comprises an aryl group.

BRIEF DESCRIPTION OF THE DRAWINGS

A more complete understanding of the present invention and benefits thereof may be acquired by referring to the follow description taken in conjunction with the accompanying drawings in which:

FIG. 2 depicts the $^1$H NMR spectrum of

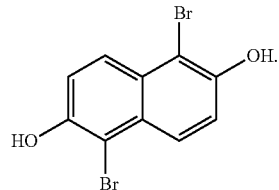

Figure 3:
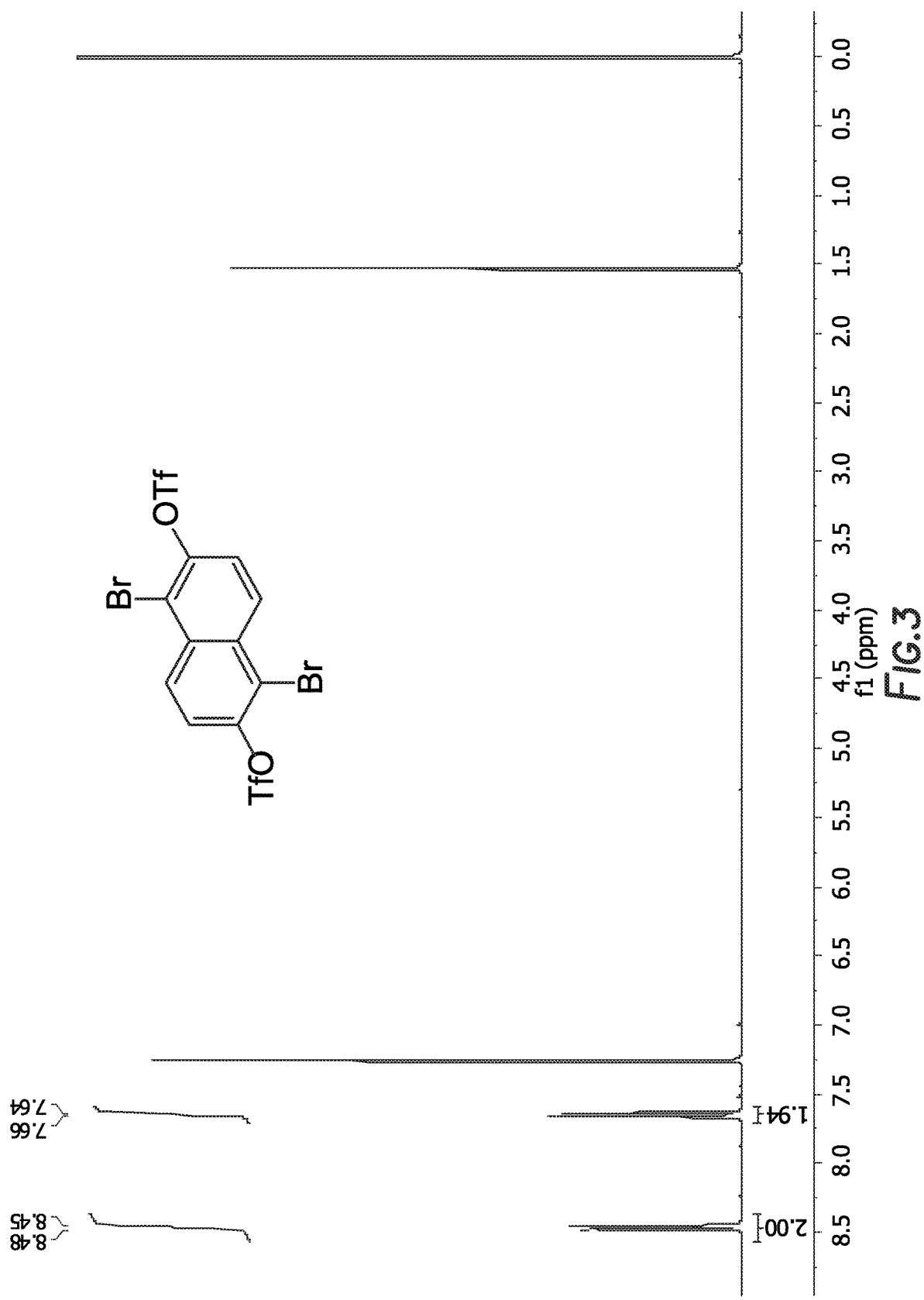

FIG. 3 depicts the $^1$H NMR spectrum of

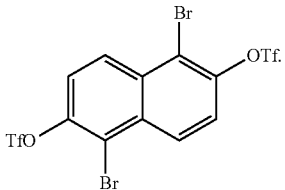 [SMILES: O=S(=O)(Oc1ccc2c(Br)c(OS(=O)(=O)C(F)(F)F)ccc2c1Br)C(F)(F)F]

Figure 4:
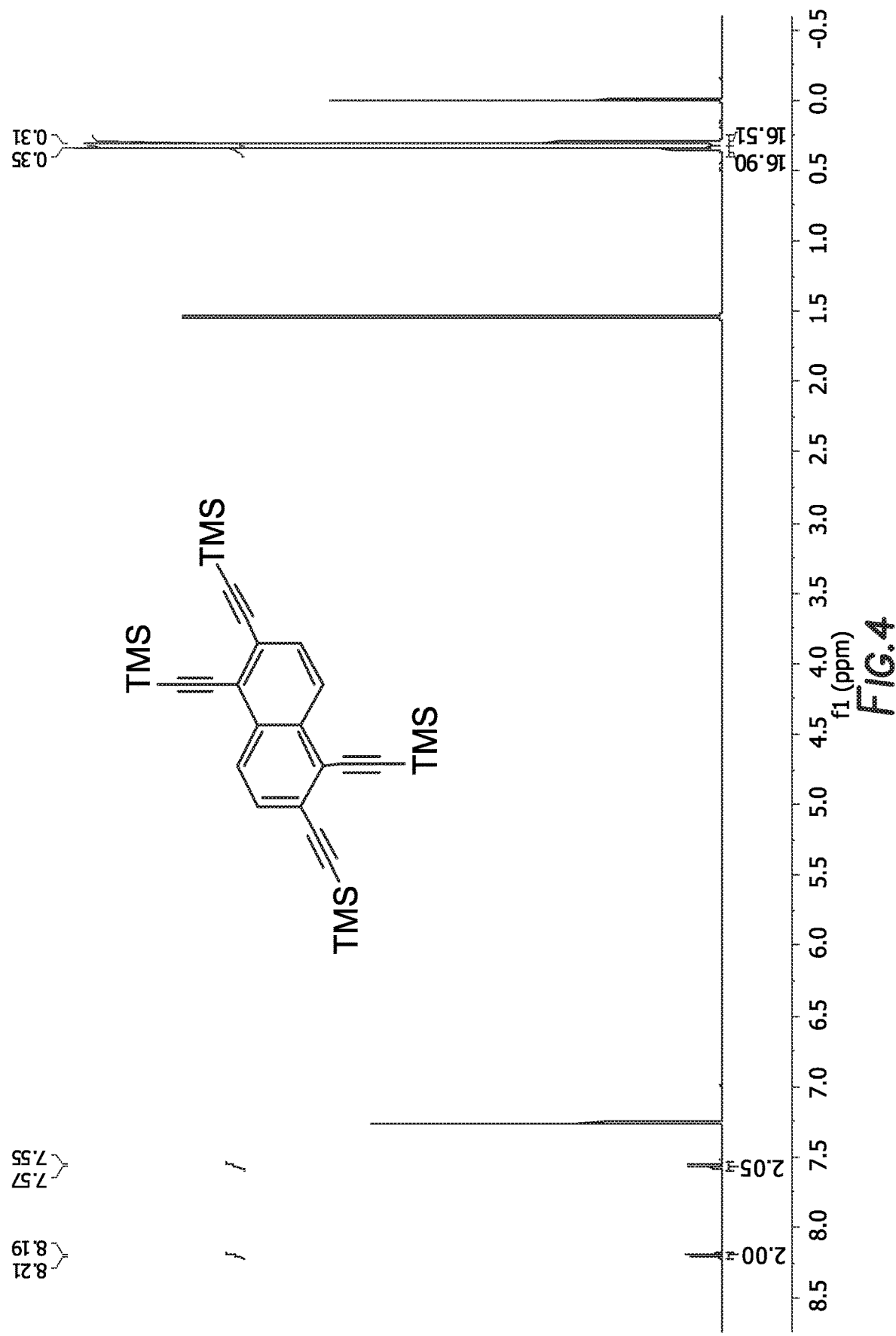

FIG. 4 depicts the $^1$H NMR spectrum of

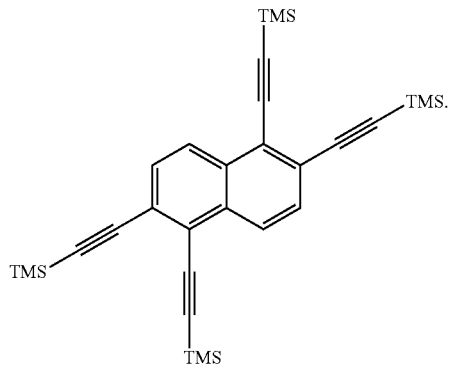 [SMILES: C[Si](C)(C)C#Cc1ccc2c(C#C[Si](C)(C)C)c(C#C[Si](C)(C)C)ccc2c1C#C[Si](C)(C)C]

Figure 5:
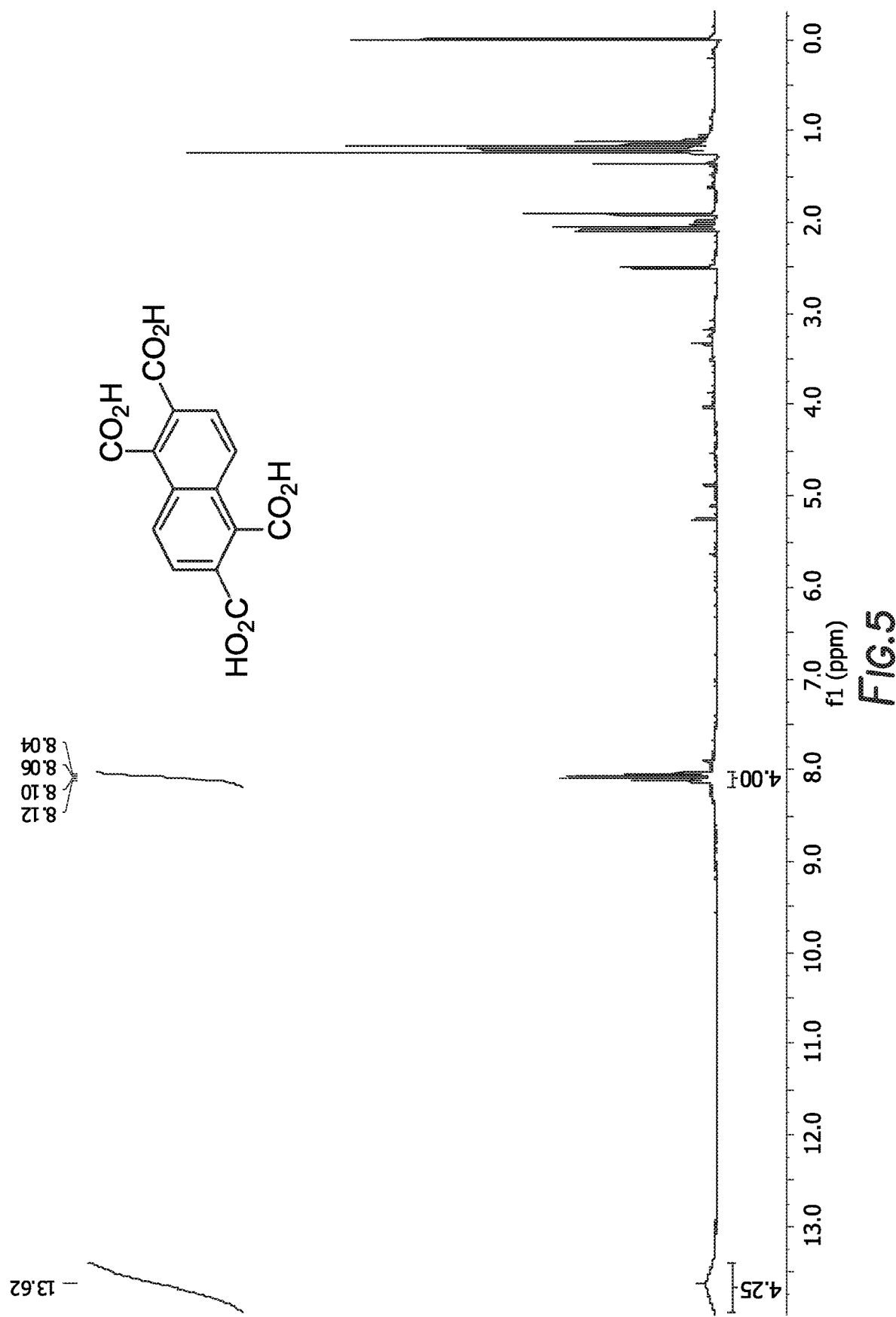

FIG. 5 depicts the $^1$H NMR spectrum of

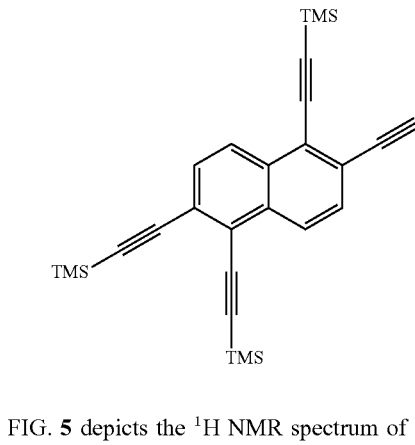

Figure 6:
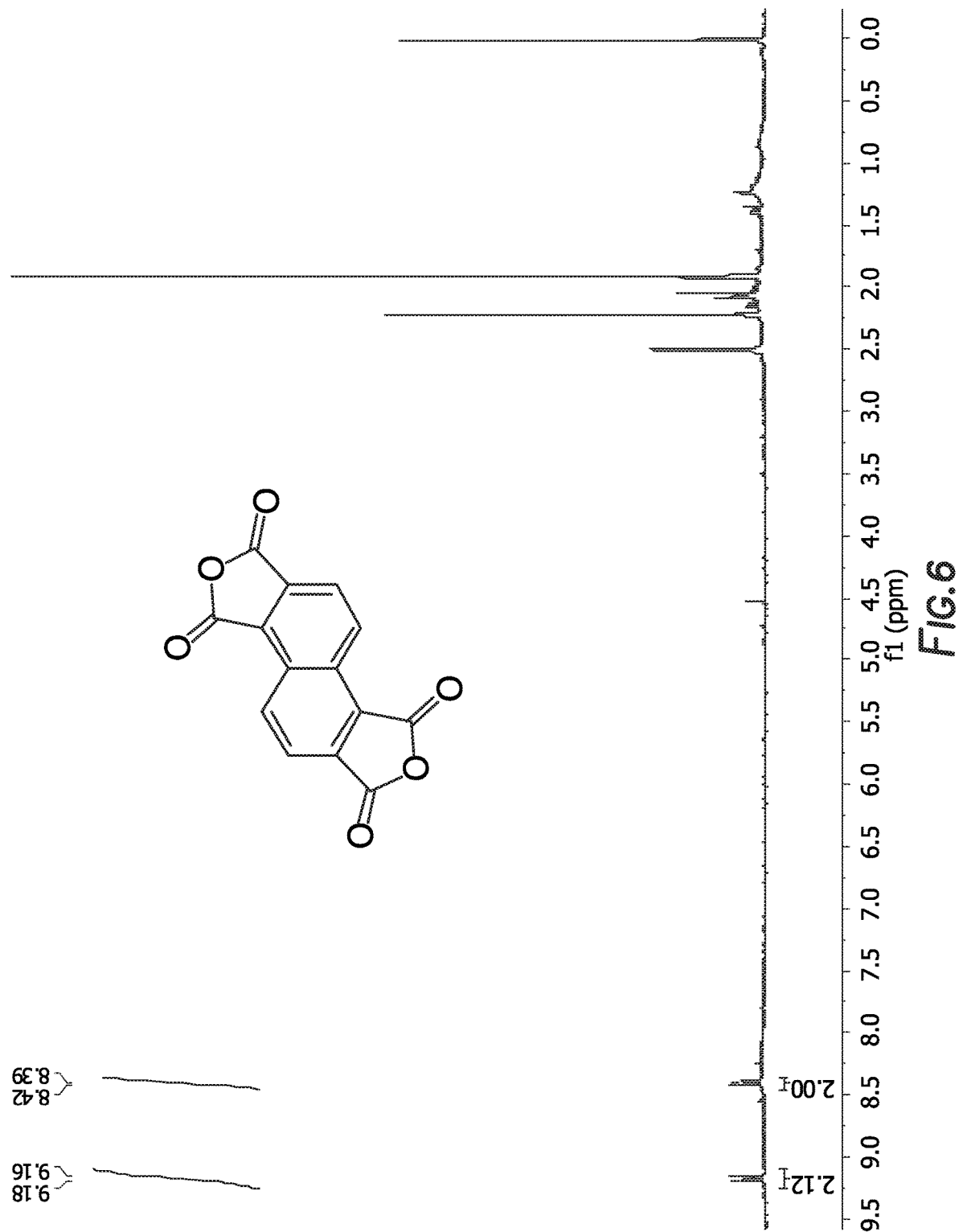

FIG. 6 depicts the ¹H NMR spectrum of

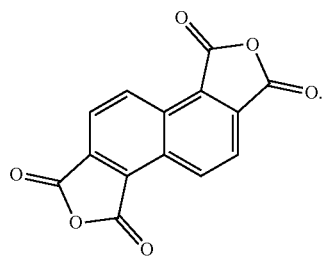 [SMILES: O=c1oc(=O)c2c1ccc1c2ccc2c(=O)oc(=O)c21]

Figure 7:
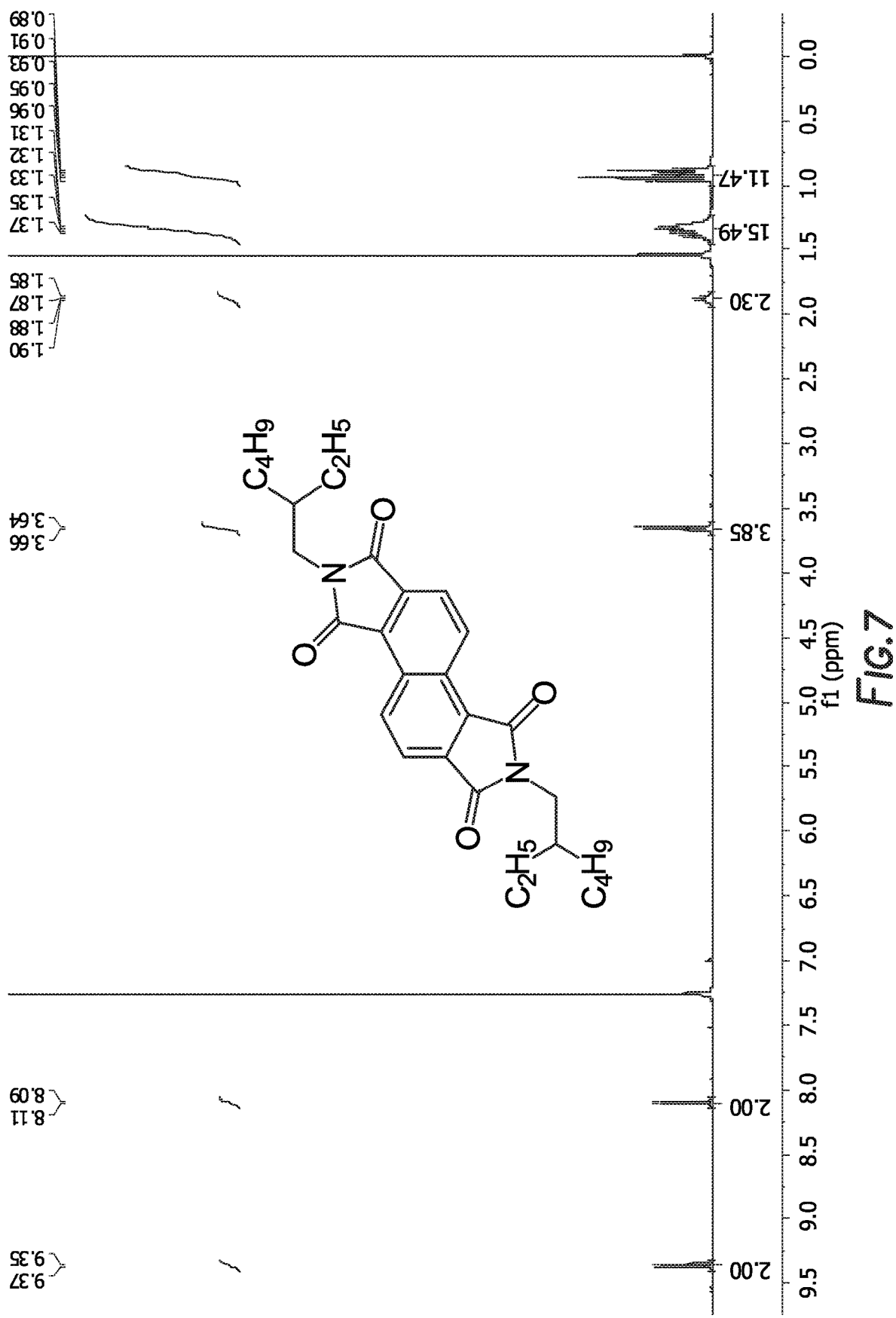

FIG. 7 depicts the ¹H NMR spectrum of

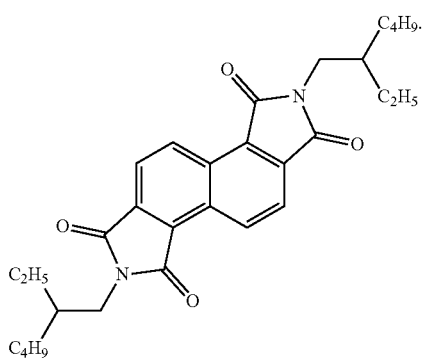

Figure 8:
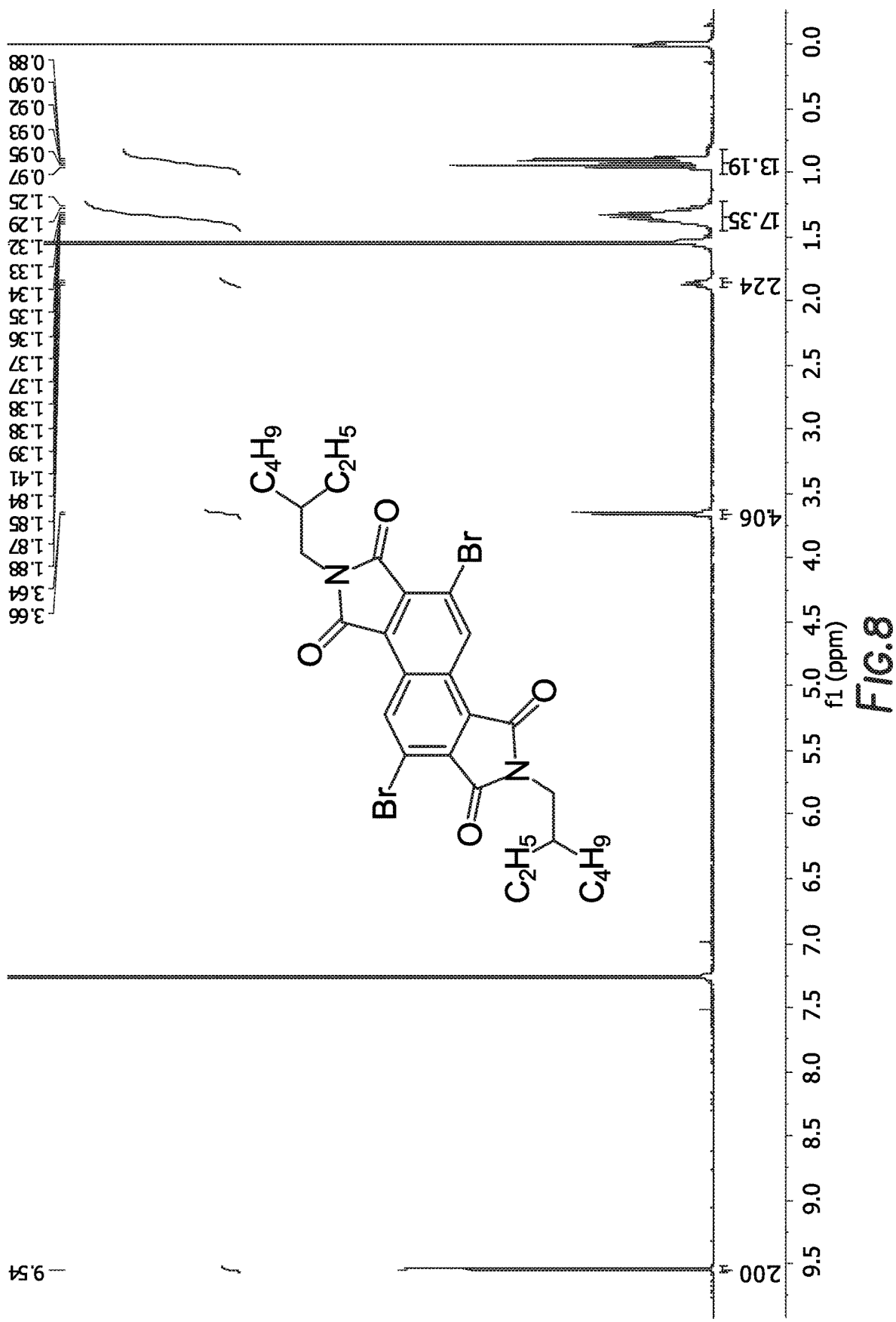

FIG. 8 depicts the ¹H NMR spectrum of

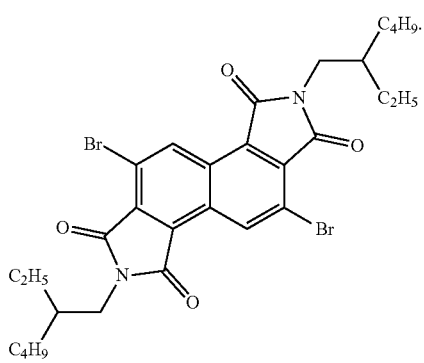

Figure 9:
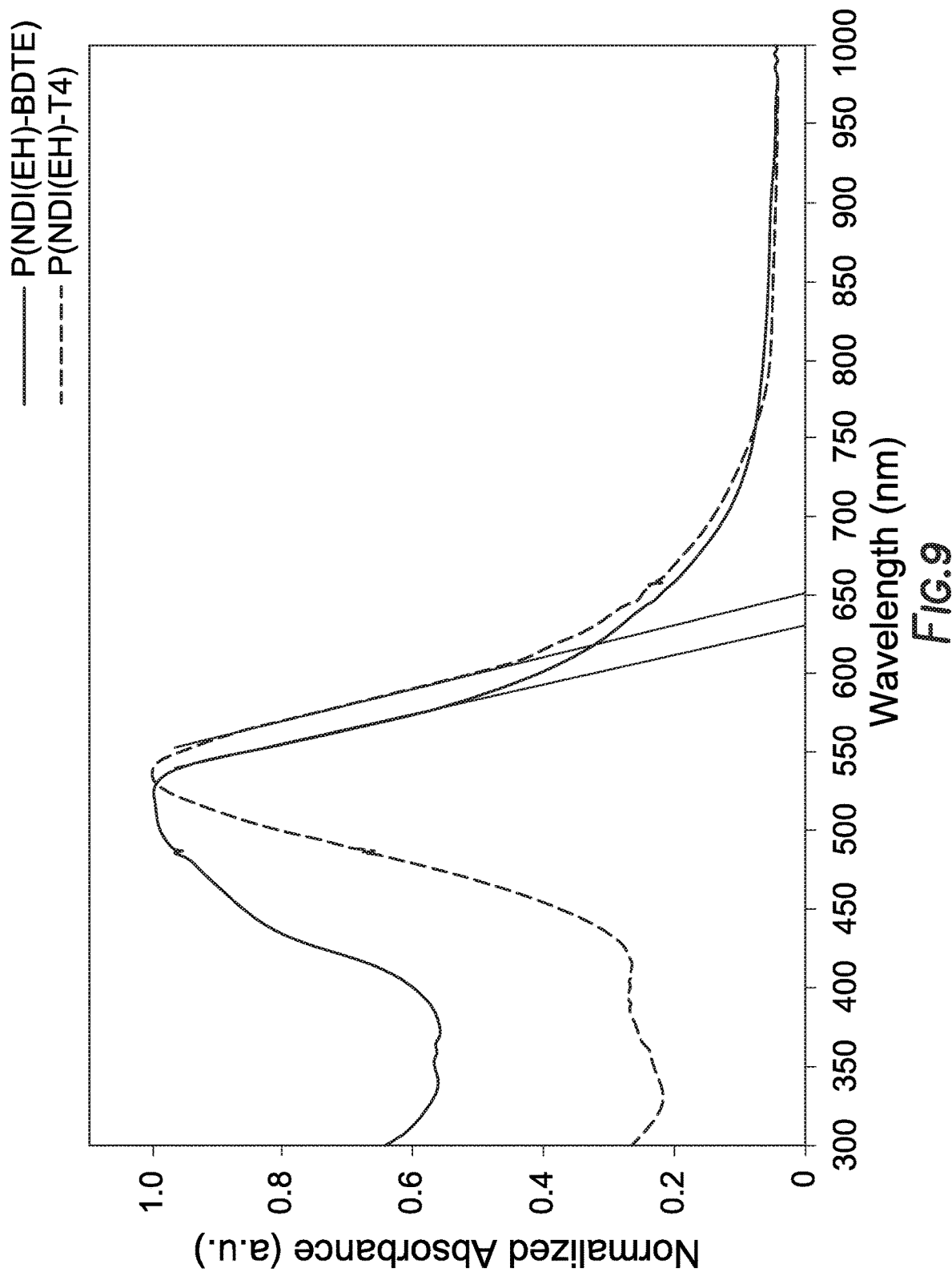

FIG. 9 depicts the UV-Visible absorption spectra of the polymer A and polymer C.

Figure 10:
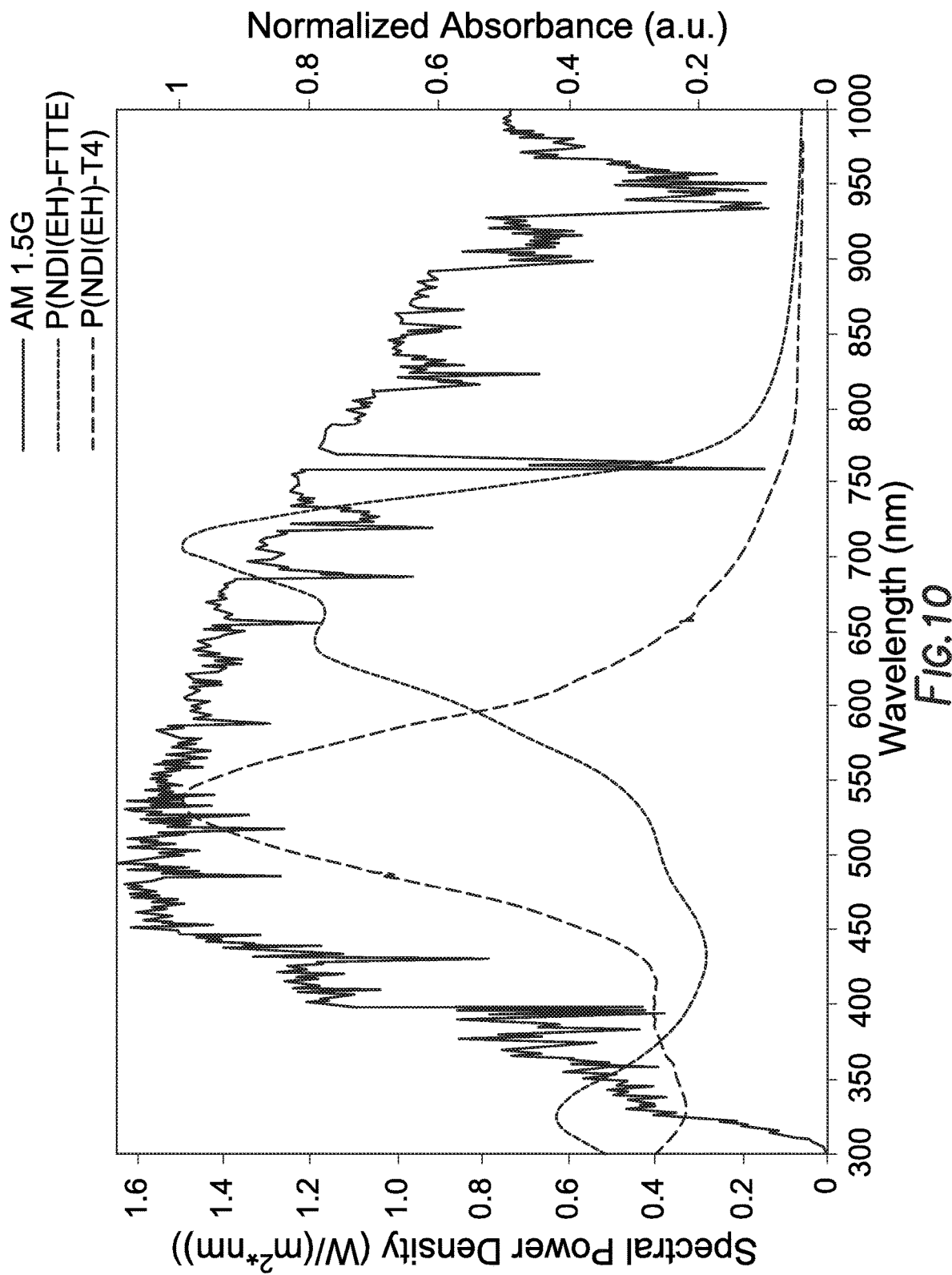

FIG. 10 depicts the UV-Visible absorption spectra of the polymer A and polymer C as a result of the solar simulator.

DETAILED DESCRIPTION

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

"Alkyl," as used herein, refers to an aliphatic hydrocarbon chains. In one embodiment, the aliphatic hydrocarbon chains are of 1 to about 100 carbon atoms, preferably 1 to 30 carbon atoms, more preferably, 1 to 20 carbon atoms, and even more preferably, and includes straight and branched chains such as methyl, ethyl, n-propyl, isopropyl, n-butyl, isobutyl, sec-butyl, t-butyl, n-pentyl, isopentyl, neo-pentyl, n-hexyl, and isohexyl. In this application alkyl groups can include the possibility of substituted and unsubstituted alkyl groups.

"Alkoxy," as used herein, refers to the group R—O— where R is an alkyl group of 1 to 100 carbon atoms. In this application alkoxy groups can include the possibility of substituted and unsubstituted alkoxy groups.

"Aryl" as used herein, refers to an optionally substituted, mono-, di-, tri-, or other multicyclic aromatic ring system having from about 5 to about 50 carbon atoms (and all combinations and subcombinations of ranges and specific numbers of carbon atoms therein), with from about 6 to about 20 carbons being preferred. Non-limiting examples include, for example, phenyl, naphthyl, anthracenyl, and phenanthrenyl. Aryl groups can be optionally substituted with one or with one or more Rx. In this application aryl groups can include the possibility of substituted aryl groups, bridged aryl groups and fused aryl groups.

"Ester", as used herein, represents a group of formula —COOR wherein R represents an "alkyl", "aryl", a "heterocycloalkyl" or "heteroaryl" moiety, or the same substituted as defined above "Ketone" as used herein, represents an organic compound having a carbonyl group linked to a carbon atom such as —C(O)Rx wherein Rx can be alkyl, aryl, cycloalkyl, cycloalkenyl or heterocycle.

"Amide" as used herein, represents a group of formula "—C(O)NR$^x$R$^y$," wherein R$^x$ and R$^y$ can be the same or independently H, alkyl, aryl, cycloalkyl, cycloalkenyl or heterocycle.

The following examples of certain embodiments of the invention are given. Each example is provided by way of explanation of the invention, one of many embodiments of the invention, and the following examples should not be read to limit, or define, the scope of the invention.

Device Architecture

Figure 1:
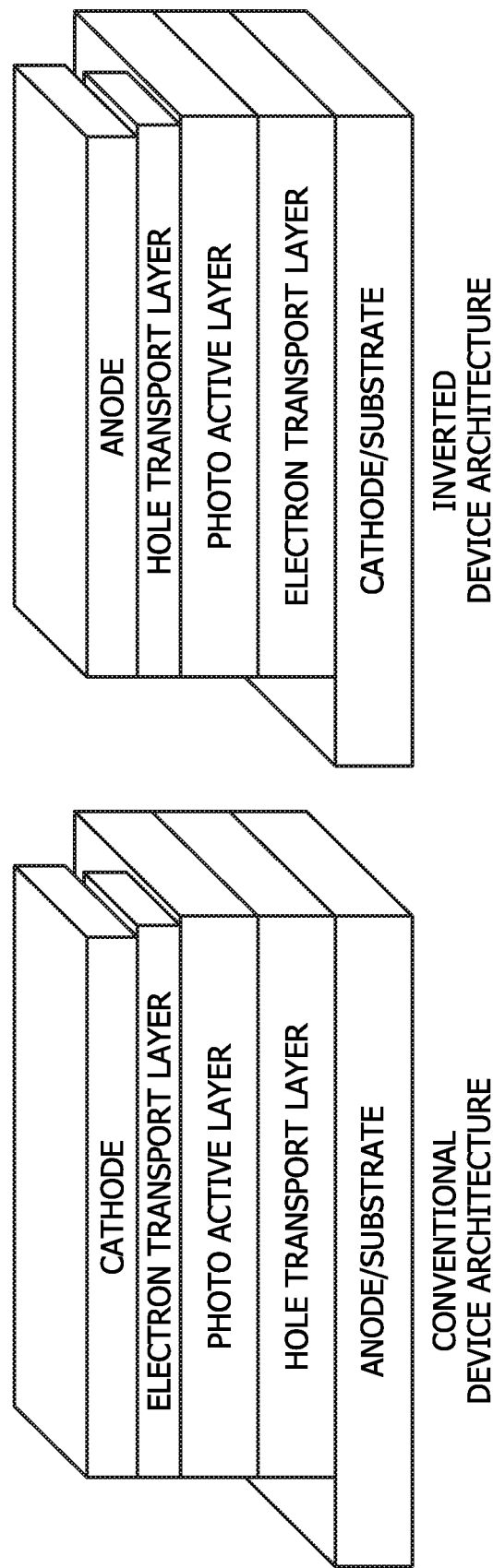
FIG. 1 depicts a conventional device architecture and an inverted device architecture.

When used as a photovoltaic device the architecture may be a conventional architecture device, while in others it may be an inverted architecture device. A conventional architecture device typically comprised of multilayered structure with a transparent anode as a substrate to collect positive charge (holes) and a cathode to collect negative charge (electrons), and a photo-active layer sandwiched in between two electrodes. An additional charge transport interlayer is inserted in between active layer and electrode for facile hole and electron transport. Each charge transport layer can be consisted of one or more layers. An inverted device has the same multilayered structure as the conventional architecture device whereas it uses a transparent cathode as a substrate to collect electrons and a cathode to collect holes. The inverted device also has the photo-active layer and additional charge transport layers sandwiched in between two electrodes. FIG. 1 depicts a conventional device architecture and an inverted device architecture. Repeat Unit A:

In one embodiment, repeat unit A comprises a 1,2,5,6-naphthalenediimide monomer

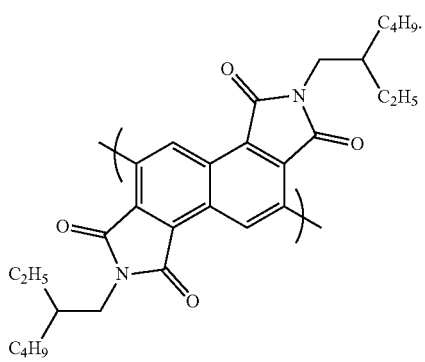

In one embodiment, the method of synthesizing the 1,2,5,6-Naphthalenediimide monomer can involve converting 2,6-naphthalene diol to produce

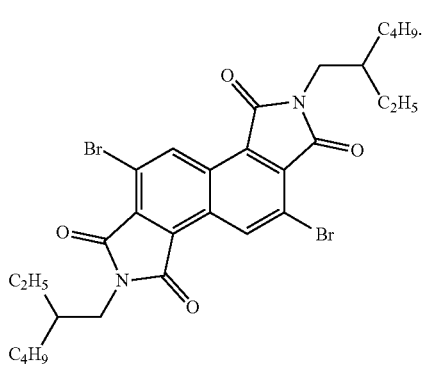

In one embodiment of the method, the temperature does not exceed about 290° C. In other embodiments, none of the reactions in this method exceed 280° C., 270° C., 260° C., 250° C., 240° C., 230° C., 220° C., 210° C., 200° C., 190° C., 180° C., 170° C., 160° C., or even 150° C. In yet another embodiment, the conversion from 2,6-naphthalene diol to produce

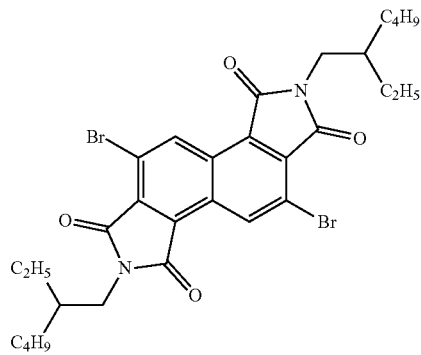

does not contain cyanide-containing reagents.

In one embodiment, the method of producing 1,2,5,6-naphthalenediimide monomer can begin by brominating 2,6-naphthalene diol to produce:

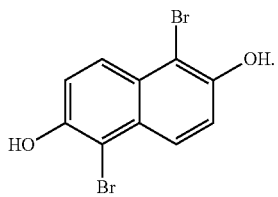

The diols of

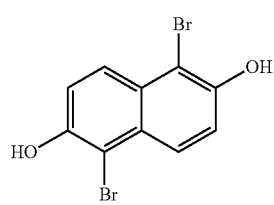 [SMILES: Oc1ccc2c(Br)c(O)ccc2c1Br]

are then converted into

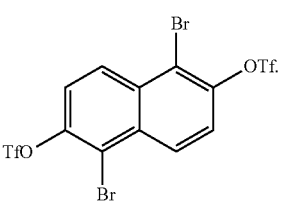

During this conversion, the triflic anhydride can either be added before the pyridine or after the pyridine.

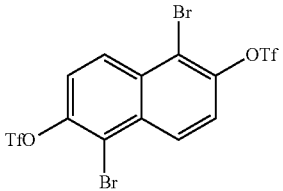

is then exposed to a Sonogashira coupling condition to form

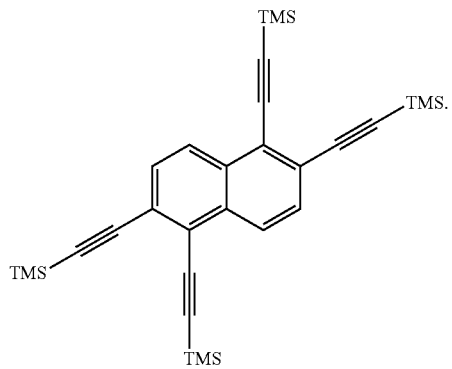

-continued

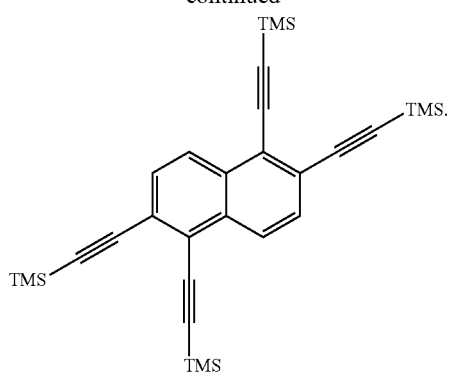

was then oxidized to produce:

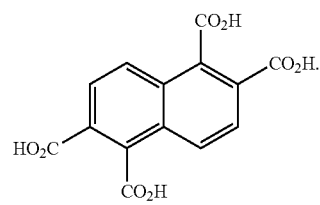

This was then followed by cyclizing

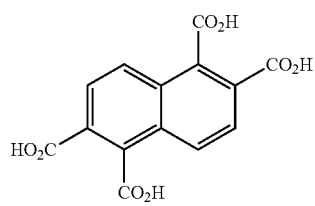

to produce

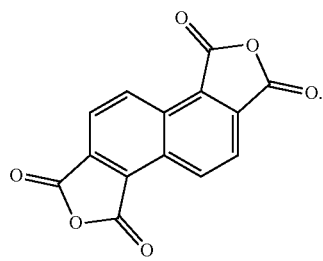

A conversion of

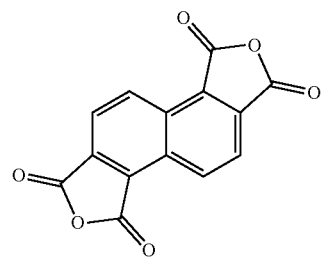

to produce

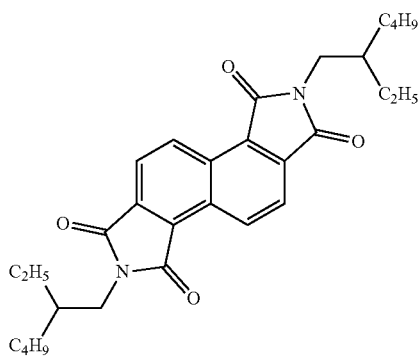

followed by a bromination to produce

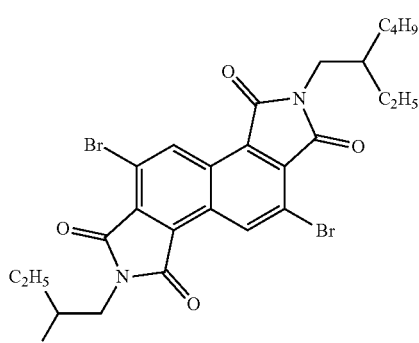

completes the method.

In one embodiment, the method of producing a 1,2,5,6-naphthalenediimide monomer can also be expressed as a series of reactions. In this method reacting 2,6-naphthalene diol to produce reaction mixture A, wherein reaction mixture A comprises:

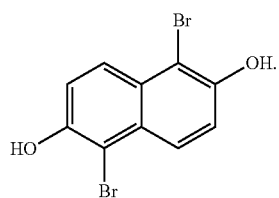

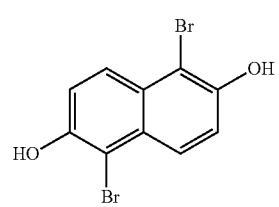 [SMILES: Oc1ccc2c(Br)c(O)ccc2c1Br]

is then reacted to produce reaction mixture B, wherein reaction mixture B comprises:

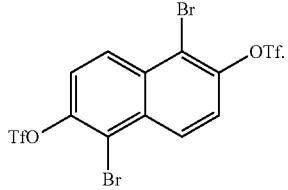 [SMILES: O=S(=O)(Oc1ccc2c(Br)c(OS(=O)(=O)C(F)(F)F)ccc2c1Br)C(F)(F)F]

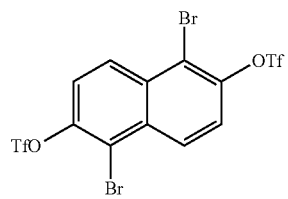 [SMILES: O=S(=O)(Oc1ccc2c(Br)c(OS(=O)(=O)C(F)(F)F)ccc2c1Br)C(F)(F)F]

is then reacted to produce reaction mixture C, wherein reaction mixture C comprises:

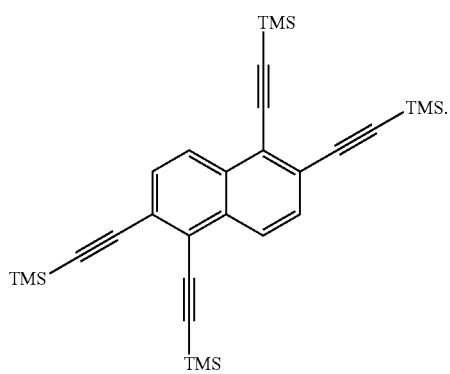

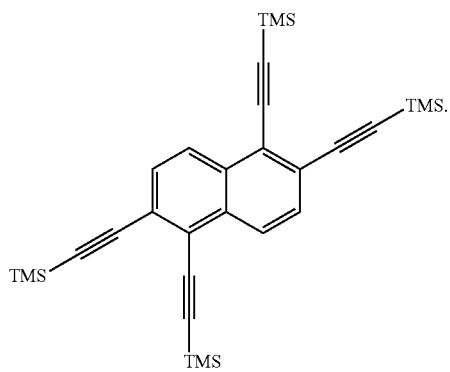

is then reacted to produce reaction mixture D, wherein reaction mixture D comprises:

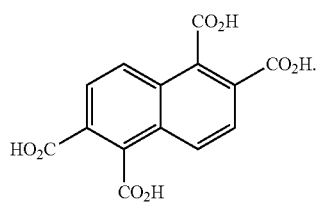 [SMILES: O=C(O)c1ccc2c(C(=O)O)c(C(=O)O)ccc2c1C(=O)O]

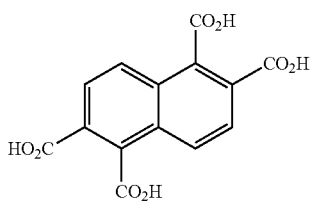 [SMILES: O=C(O)c1ccc2c(C(=O)O)c(C(=O)O)ccc2c1C(=O)O]

is then reacted to produce reaction mixture E, wherein reaction mixture E comprises:

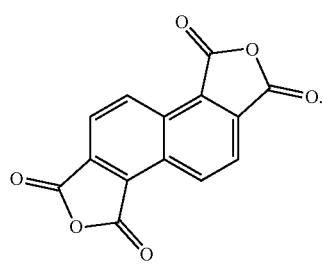 [SMILES: O=c1oc(=O)c2c1ccc1c2ccc2c(=O)oc(=O)c21]

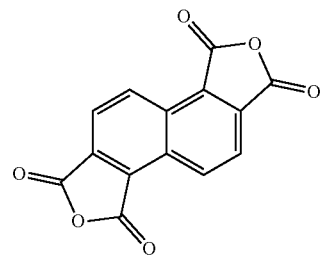 [SMILES: O=c1oc(=O)c2c1ccc1c2ccc2c(=O)oc(=O)c21]

is then reacted to produce reaction mixture F, wherein reaction mixture F comprises:

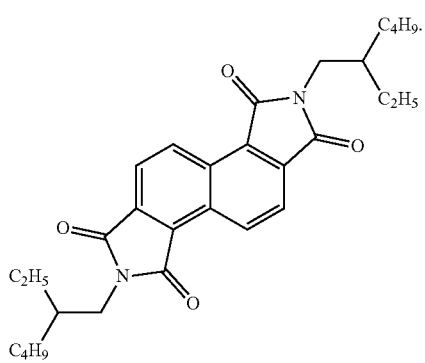

The final reaction involves reacting

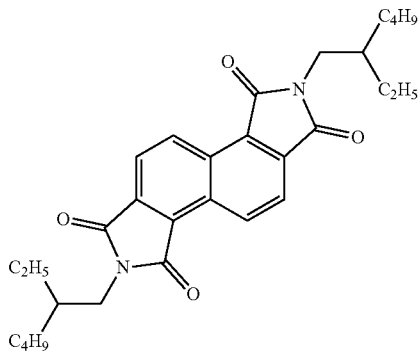

to produce reaction mixture G, wherein reaction mixture G comprises:

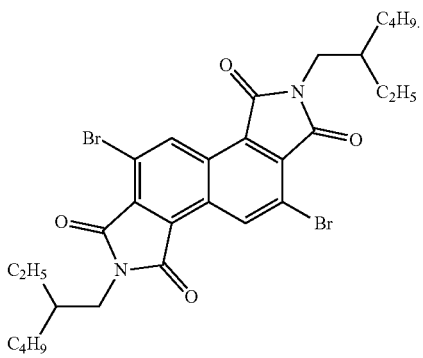

In a more detailed embodiment of producing a 1,2,5,6-naphthalenediimide monomer, the method can begin by taking a solution of 2,6-naphthalene diol (10.16 g, 63.43 mmol) in tetrahydrofuran (110 mL) and cooling the solution to about 0° C., then treated slowly with N-bromosuccinimide (22.58 g, 0.13 mol). The flask was then topped with a water condenser and heated to around 60° C. for around 3 hours, then cooled to room temperature. This reaction mixture A was diluted with a saturated aqueous Na$_2$S$_2$O$_3$ solution (~250 mL) and water (~1.5 L), and the resulting solid was collected by filtration, and then left under vacuum for around 18 hours. The desired product,

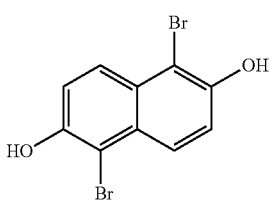 [SMILES: Oc1ccc2c(Br)c(O)ccc2c1Br]

(19.5 g, 0.061 mol, 97% yield), was obtained as a tan solid. The $^1$H NMR spectrum of

Figure 2:
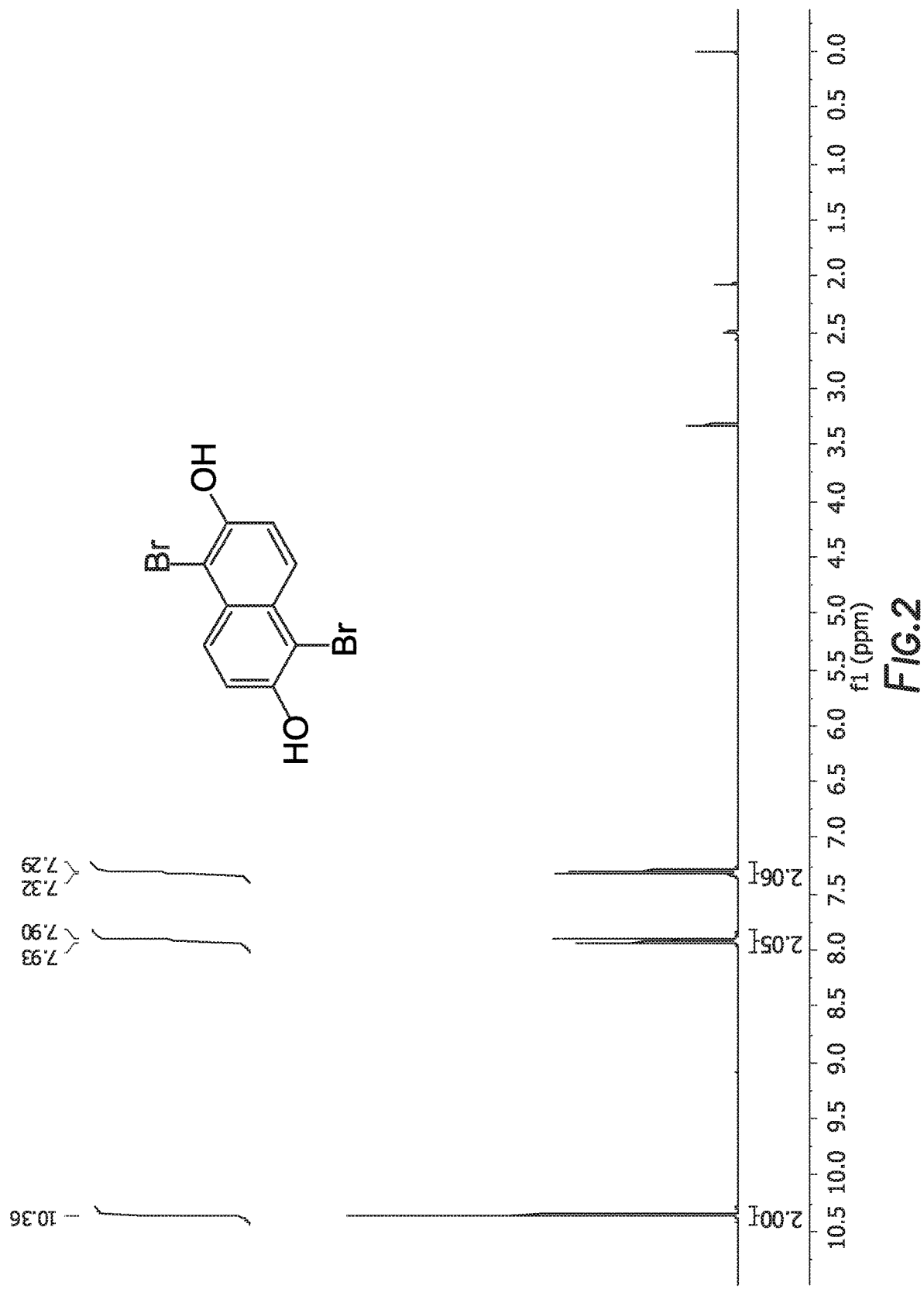

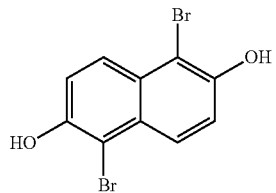 [SMILES: Oc1ccc2c(Br)c(O)ccc2c1Br]

is shown in FIG. 2.

The next reaction in the method involves charging

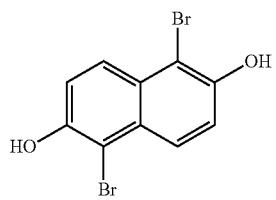 [SMILES: Oc1ccc2c(Br)c(O)ccc2c1Br]

in a Schlenk flask. A hot, oven-dried Schlenk flask was evacuated for about 30 min, refilled with argon, then charged with

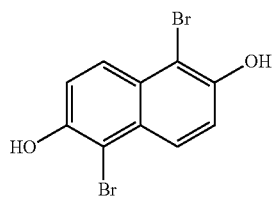 [SMILES: Oc1ccc2c(Br)c(O)ccc2c1Br]

(10 g, 31.45 mmol) and evacuated for about 1 hour. The flask was refilled with argon and dry dichloromethane (300 mL) was added. The resulting suspension was cooled to about 0° C. for about 15 min, then triflic anhydride (11.62 mL, 0.069 mol) was added dropwise, followed by the dropwise addition of pyridine (15.2 mL, 0.189 mol). The reaction was then gradually warmed to room temperature and stirred for about 18 hours. The reaction mixture was diluted with dichloromethane and water, then transferred to a separatory funnel. The aqueous layer was acidified with hydrochloric acid, then extracted with dichloromethane. The combined organic extracts were dried (MgSO$_4$), filtered, and concentrated into reaction mixture B. Reaction mixture B was then diluted with a mixture of dichloromethane and acetone, applied to the top of a 4"×6" column, and eluted with dichloromethane. All fractions containing

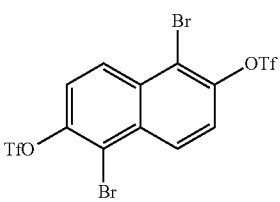 [SMILES: O=S(=O)(Oc1ccc2c(Br)c(OS(=O)(=O)C(F)(F)F)ccc2c1Br)C(F)(F)F]

were concentrated. The material was then dissolved in dichloromethane, adsorbed onto silica gel and purified on a 340 g Biotage silica gel cartridge with a 10-30% dichloromethane/hexanes gradient. Fractions containing pure product

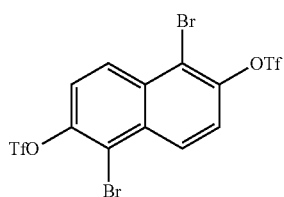 [SMILES: O=S(=O)(Oc1ccc2c(Br)c(OS(=O)(=O)C(F)(F)F)ccc2c1Br)C(F)(F)F]

were concentrated (15.2 g, 0.026 mol, 83% yield) and was a white, crystalline solid. The $^1$H NMR spectrum of

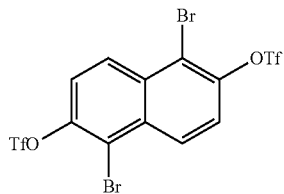 [SMILES: O=S(=O)(Oc1ccc2c(Br)c(OS(=O)(=O)C(F)(F)F)ccc2c1Br)C(F)(F)F]

is shown in FIG. 3.

The next reaction in the method involves first taking a hot, oven-dried Schlenk flask and evacuating for about 1 hour, followed by refilled with argon.

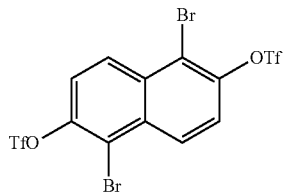 [SMILES: O=S(=O)(Oc1ccc2c(Br)c(OS(=O)(=O)C(F)(F)F)ccc2c1Br)C(F)(F)F]

(11.6 g, 19.9 mmol), CuI (1.14 g, 6 mmol), and Pd(PPh$_3$)$_2$Cl$_2$ (2.1 g, 3 mmol) are then added to the flask, and then degassed for about 30 min. After refilling with argon, dry tetrahydrofuran (50 mL, mol) was added, and two freeze-pump-thaw cycles were performed. The mixture was then warmed to room temperature and treated with triethylamine (16.7 mL, 120 mmol) and trimethylsilylacetylene (28.4 mL, 200 mmol). The reaction was then stirred at about 40° C. for about 3 days. The reaction mixture C was cooled to room temperature, then poured into water and extracted with dichloromethane. The combined organic extracts were dried (MgSO4), filtered, and concentrated. The crude material was dissolved in dichloromethane, adsorbed onto silica gel and purified on a 340 g Biotage column with a 0-15% dichloromethane/hexanes gradient. Any fractions containing product were concentrated to produce

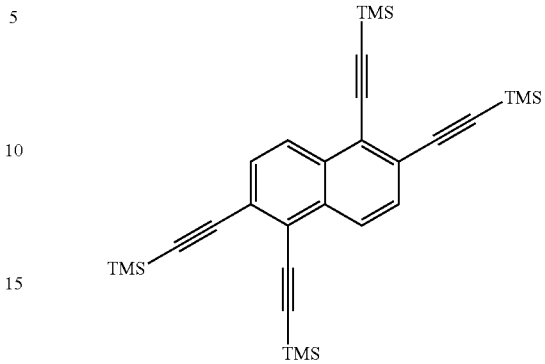

(8.3 g, 16 mmol, 62% yield) as an orange solid. The $^1$H NMR spectrum of

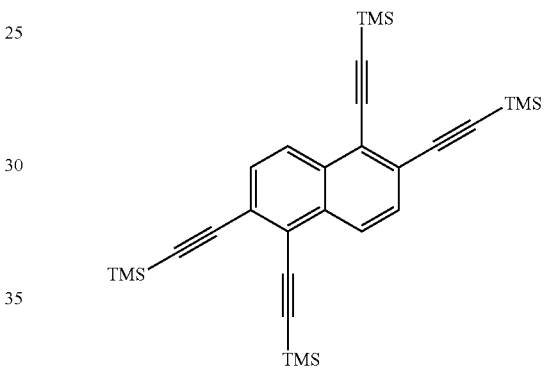

is shown in FIG. 4.

In a flask, (3.78 g, 7.4 mmol), FeCl$_3$(H$_2$O)$_6$ (0.4 g, 1.5 mmol), water (30 mL), and tert-butylhydroperoxide solution (70 wt % in water, 24.5 mL) were combined. The mixture was stirred at room temperature for 1 h, then treated with NaOH (4.7 g, 117.9 mmol), topped with a water condenser and Ar inlet, and heated to about 80° C. for about 18 hours. The reaction mixture was then cooled to room temperature, diluted with water, cooled to 0° C., and acidified with HCl to produce reaction mixture D. The reaction mixture D was filtered through filter paper, the solid was discarded, and the filtrate was transferred to a separatory funnel and extracted with ethyl acetate. The combined organic extracts were dried (MgSO$_4$), filtered, and concentrated, then left under vacuum overnight.

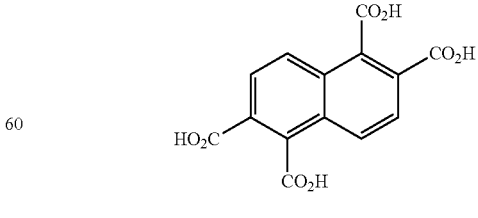

was obtained as a brown-orange solid (1.89 g, 6 mmol, 84% yield). The material was carried forward without any purification. The $^1$H NMR spectrum of is shown in FIG. 5.

The next reaction in the method begins by taking a round bottom flask and combining

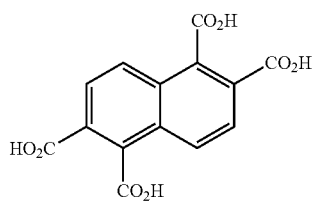 [SMILES: O=C(O)c1ccc2c(C(=O)O)c(C(=O)O)ccc2c1C(=O)O]

(1.89 g, 6.2 mmol) and acetic anhydride (45 mL), then topping with a water condenser and argon inlet, and heating to about 140° C. for about 24 hours to produce reaction mixture E. The reaction mixture E was concentrated, and

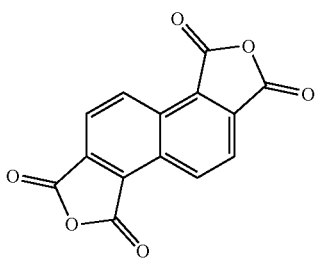 [SMILES: O=c1oc(=O)c2c1ccc1c2ccc2c(=O)oc(=O)c21]

(1.63 g, 6 mmol, 98% yield) was obtained as a dark brown, flaky solid.

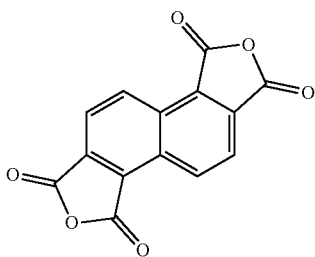 [SMILES: O=c1oc(=O)c2c1ccc1c2ccc2c(=O)oc(=O)c21]

was used without any purification. The ¹H NMR spectrum of

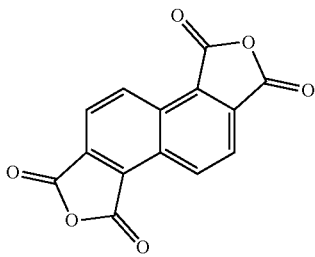 [SMILES: O=c1oc(=O)c2c1ccc1c2ccc2c(=O)oc(=O)c21]

is shown in FIG. 6.

The next step in the method begins by having

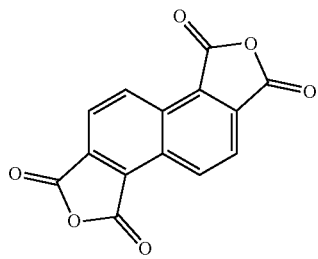 [SMILES: O=c1oc(=O)c2c1ccc1c2ccc2c(=O)oc(=O)c21]

(2.8 g, 10 mmol) in a flask and leaving it under vacuum for about 2 hours. The flask was refilled with argon, and toluene (100 mL) and 2-ethylhexylamine (5.1 mL, 31 mmol) were added. The flask was equipped with a water condenser and argon balloon, and the reaction was heated to about 110° C. for about 18 hours. The reaction mixture was concentrated and the residue was treated with thionyl chloride (60 mL), topped with a water condenser and argon balloon, and heated to about 80° C. for about 5 hours. The thionyl chloride was removed via rotovap, and the remaining residue, reaction mixture F, was dissolved in dichloromethane, adsorbed onto silica gel, and purified on a 100 g Biotage silica gel column with a 30-100% dichloromethane/hexanes gradient. Reaction mixture F was concentrated to produce

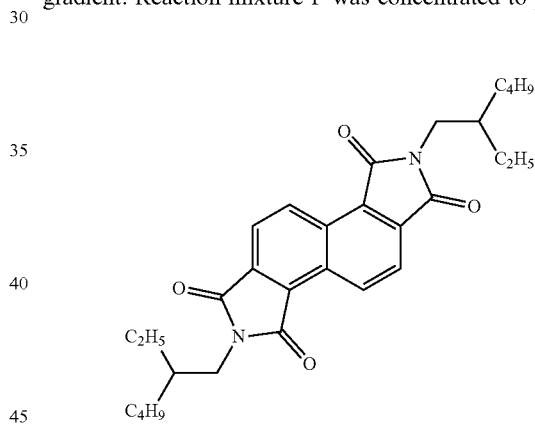

(1.7 g, 3 mmol, 33% yield) as a tan solid. The ¹H NMR spectrum of

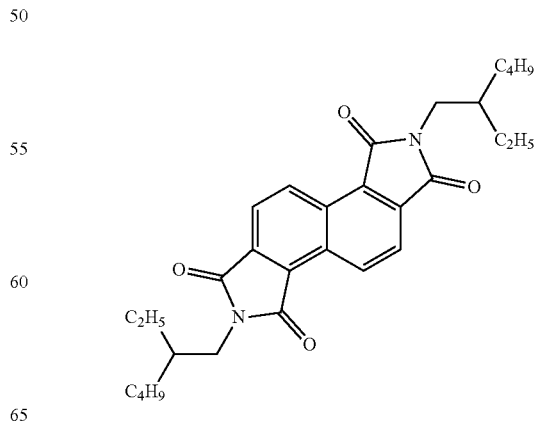

is shown in FIG. 7.

The final step in the method begins by dissolving

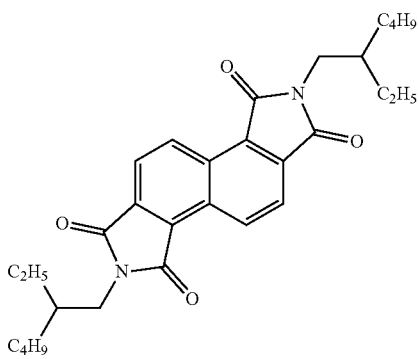

(1.2 g, 2 mmol) in a round bottom flask, with trifluoroacetic acid (12 mL) and sulfuric acid (3 mL), then treated portionwise with N-bromosuccinimide (1.3 g, 7 mmol). The flask was topped with an argon balloon and the reaction was heated to about 55° C. for about 18 hours. Thin layer chromatography of the reaction mixture showed some unreacted starting material, so additional N-bromosuccinimide (0.44 g, 2 mmol) was added, and the reaction stirred at about 5° C. for about 1 hour. After cooling to room temperature, the reaction was quenched with ice, then transferred to a separatory funnel and extracted with dichloromethane to produce reaction mixture G. The organic extracts of reaction mixture G were then dried (MgSO$_4$), filtered, and concentrated. The crude material was then dissolved in dichloromethane, adsorbed onto silica, and purified on a 100 g Biotage silica gel column with a 0-100% dichloromethane/hexanes gradient. Reaction mixture G was then concentrated to afford to produce

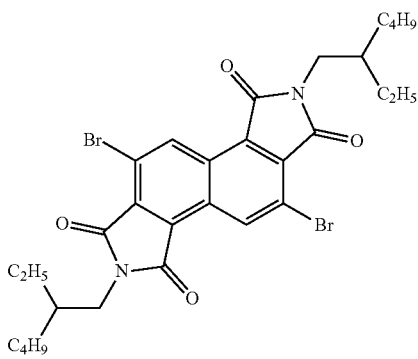

(380 mg, 0.586 mmol, 24% yield) as a yellow solid. The $^1$H NMR spectrum of

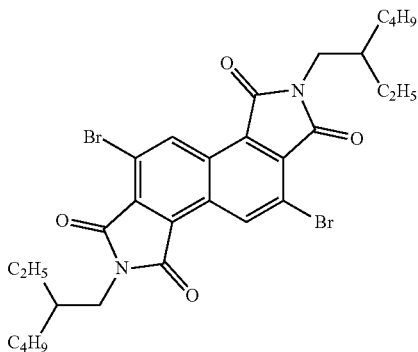

is shown in FIG. 8.

Repeat unit B:

In one embodiment, at least one repeat unit B refers to an optionally substituted, mono-, di-, tri-, or other multicyclic aromatic ring system having from about 5 to about 50 carbon atoms (and all combinations and subcombinations of ranges and specific numbers of carbon atoms therein), with from about 6 to about 20 carbons being preferred. Non-limiting examples include, for example, phenyl, naphthyl, anthracenyl, and phenanthrenyl. Aryl groups can be optionally substituted with one or with one or more Rx. In this application aryl groups can include the possibility of substituted aryl groups, bridged aryl groups and fused aryl groups. While it is feasible that there is only one repeat unit B in the copolymer, it is also envisioned that multiple repeat unit B's can exist within the copolymer.

In one embodiment, the aryl group can consist of:

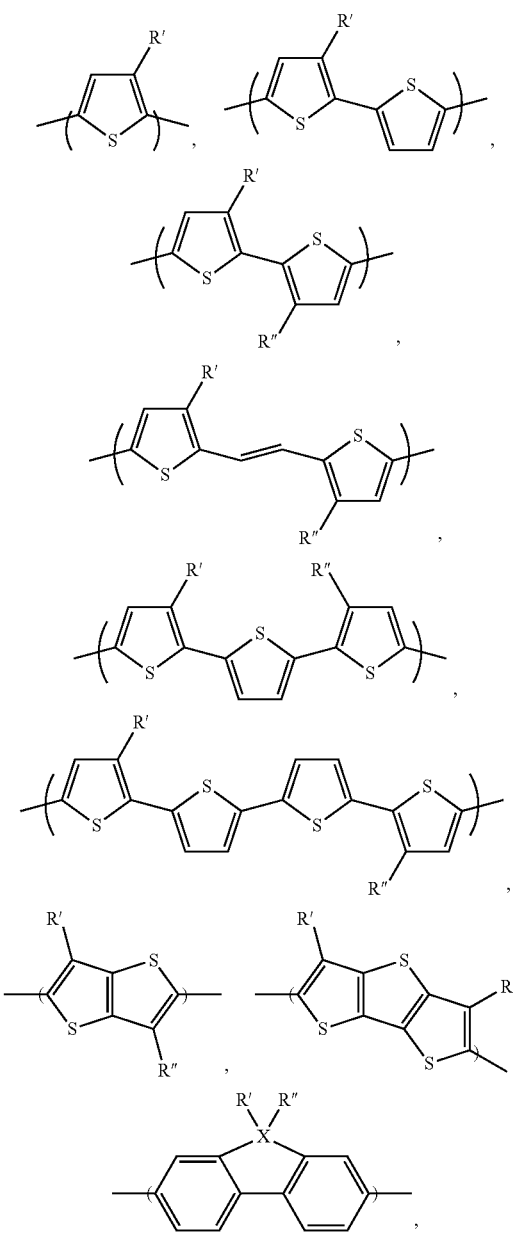

-continued

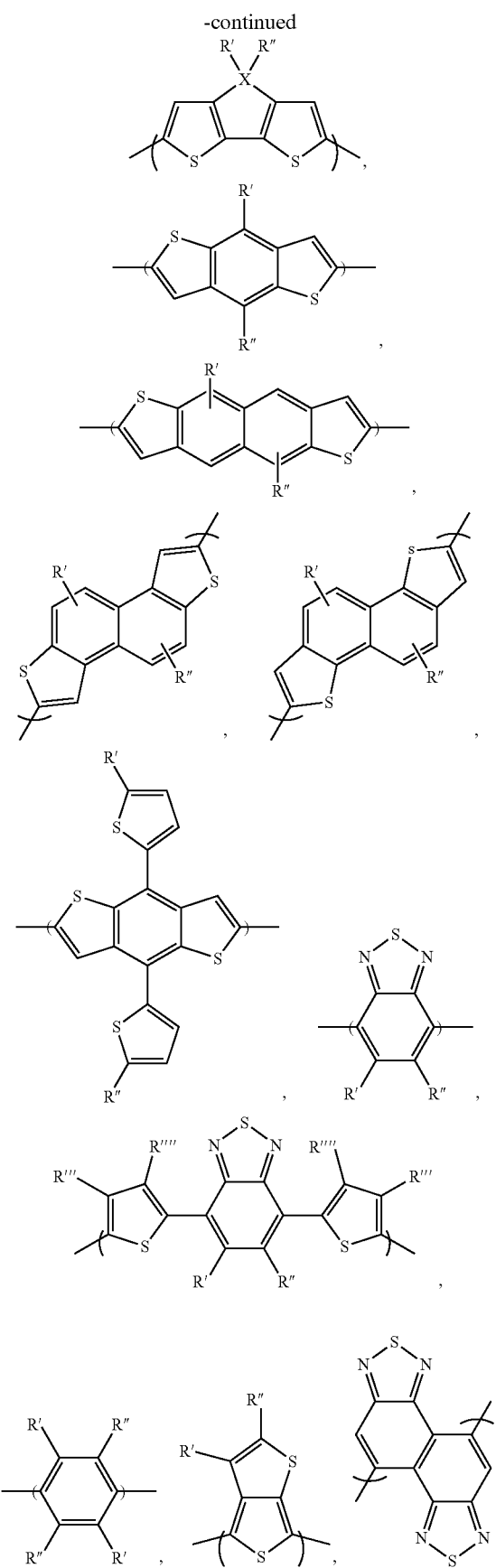

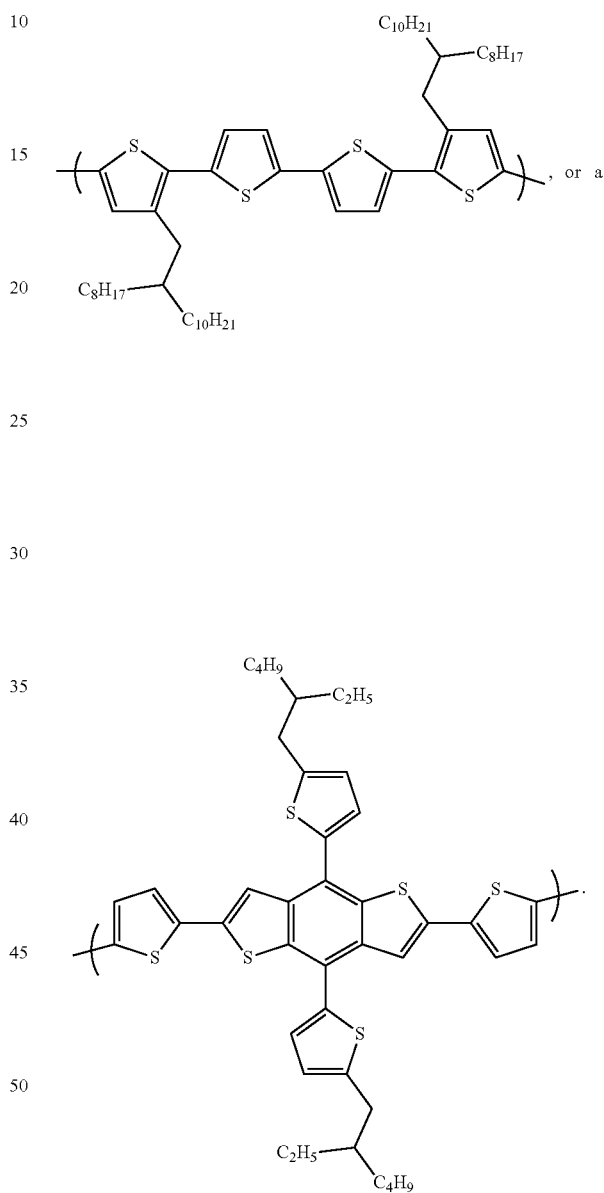

and combinations thereof, wherein R' and R" are independently selected from the group consisting of: H, Cl, F, CN, alkyl, alkoxy, alkylthio, ester, ketone and aryl groups. In another embodiment, the aryl group is a 3,3'difluror-2,2'-bithiophene, a benzo[1,2-b:4,5-b']dithiophene, a , or a Copolymer When combined, repeat unit A and repeat unit B produce a copolymer. The copolymer can be regio-random or regio-regular. It is envisioned that the copolymer can be used as a photovoltaic material. It is also envisioned that the copolymer can be used as an active layer in an electronic device. In one embodiment, the number of repeat units A and B can range from about 3 to about 10,000 in the copolymer.

In some embodiments, the copolymer can be:

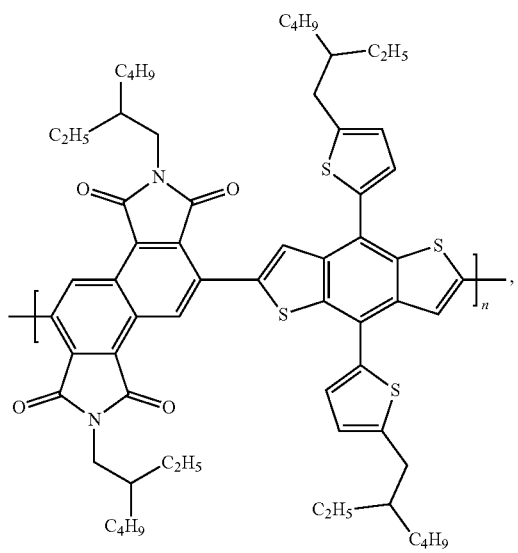

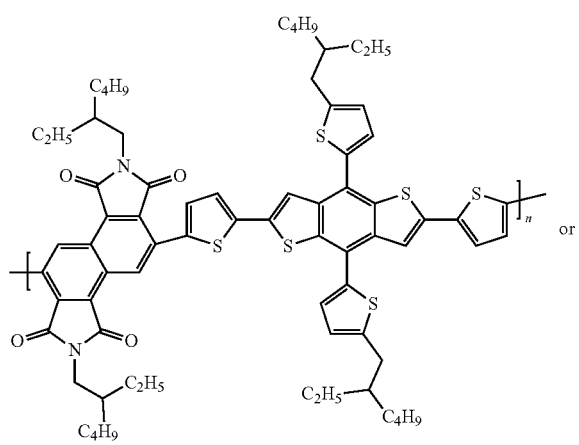

or

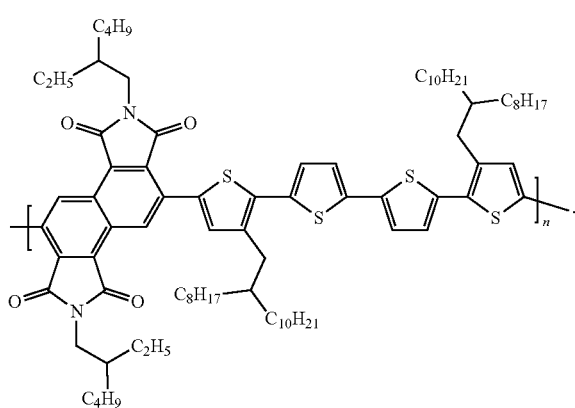

In one embodiment, the repeat unit A and B are alternating. It is theorized that the number of repeat units in the polymer can be from 1 to 10,000, or from 1 to 1,000 or even from 1-100.

Anode

When used in as an organic photovoltaic device the copolymer can be used in conjunction with an anode. The anode for the organic photovoltaic device can be any conventionally known anode capable of operating as an organic photovoltaic device. Examples of anodes that can be used include: indium tin oxide, aluminum, carbon, graphite, graphene, PEDOT:PSS, copper, metal nanowires, $Zn_{99}InO_x$, $Zn_{98}In_2O_x$, $Zn_{97}In_3O_x$, $Zn_{95}Mg_5O_x$, $Zn_{90}Mg_{10}O_x$, and $Zn_{85}Mg_{15}O_x$.

Cathode

When used in as an organic photovoltaic device the copolymer can be used in conjunction with a cathode. The cathode for the organic photovoltaic device can be any conventionally known cathode capable of operating as an organic photovoltaic device. Examples of cathodes that can be used include: indium tin oxide, carbon, graphite, graphene, PEDOT:PSS, copper, silver, gold, metal nanowires.

Electron Transport Layer

When used in as an organic photovoltaic device the copolymer can be deposited onto an electron transport layer. Any commercially available electron transport layer can be used that is optimized for organic photovoltaic devices. In one embodiment, the electron transport layer can comprise $(AO_x)_yBO_{(1-y)}$. In this embodiment, $(AO_x)$ and $BO_{(1-y)}$ are metal oxides. A and B can be different metals selected to achieve ideal electron transport layers. In one embodiment A can be aluminum, indium, zinc, tin, copper, nickel, cobalt, iron, ruthenium, rhodium, osmium, tungsten, magnesium, indium, vanadium, titanium and molybdenum.

In one embodiment B can be aluminum, indium, zinc, tin, copper, nickel, cobalt, iron, ruthenium, rhodium, osmium, tungsten, vanadium, titanium and molybdenum.

Examples of $(AO_x)_yBO_{(1-y)}$ include: $(SnO_x)_yZnO_{(1-y)}$, $(AlO_x)_yZnO_{(1-y)}$, $(AlO_x)_yInO_{z(1-y)}$, $(AlO_x)_ySnO_{z(1-y)}$, $(AlO_x)_yCuO_{z(1-y)}$, $(AlO_x)_yWO_{z(1-y)}$, $(InO_x)_yZnO_{(1-y)}$, $(InO_x)_ySnO_{z(1-y)}$, $(InO_x)_yNiO_{z(1-y)}$, $(ZnO_x)_yCuO_{z(1-y)}$, $(ZnO_x)_yNiO_{z(1-y)}$, $(ZnO_x)_yFeO_{z(1-y)}$, $(WO_x)_yVO_{z(1-y)}$, $(WO_x)_yTiO_{z(1-y)}$, and $(WO_x)_yMoO_{z(1-y)}$.

In an alternate embodiment, various fullerene dopants can be combined with $(AO_x)_yBO_{(1-y)}$ to make an electron transport layer for the organic photovoltaic device. Examples of fullerene dopants that can be combined include

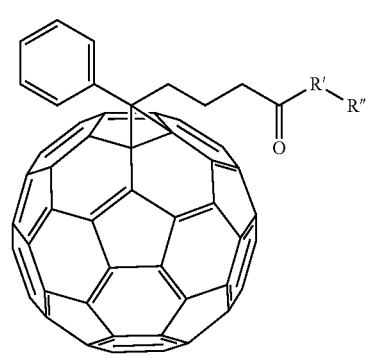

and [6,6]-phenyl-$C_{60}$-butyric-N-2-trimethylammonium ethyl ester iodide.

In the embodiment of

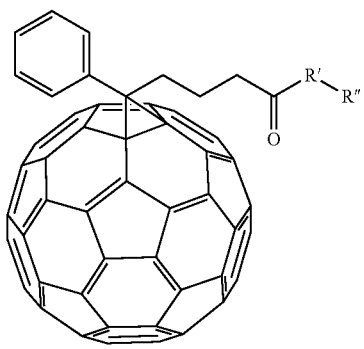

R' can be selected from either N, O, S, C, or B. In other embodiment R" can be alkyl chains or substituted alkyl chains. Examples of substitutions for the substituted alkyl chains include halogens, N, Br, O, Si, or S. In one example R" can be selected from

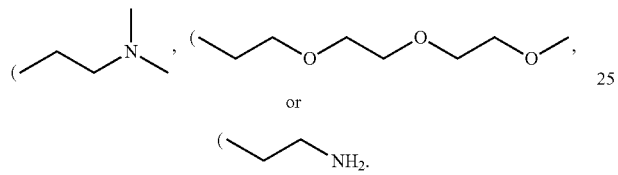

Other examples of fullerene dopants that can be used include: [6,6]-phenyl-$C_{60}$-butyric-N-(2-aminoethyl)acetamide, [6,6]-phenyl-$C_{60}$-butyric-N-triethyleneglycol ester and [6,6]-phenyl-$C_{60}$-butyric-N-2-dimethylaminoethyl ester.

Organic Photovoltaic Device Fabrication

Zinc/tin oxide (ZTO):phenyl-C60-butyric-N-(2-hydroxyethyl)acetamide (PCBNOH) sol-gel solution was prepared by dissolving zinc acetate dihydrate or tin(II) acetate in 2-methoxyethanol and ethanolamine. Specifically, the ZTO:PCBNOH sol-gel electron transport layer solution was prepared by mixing 3.98 g of $Zn(OAc)_2$, 398 mg of $Sn(OAc)_2$ and 20.0 mg PCBNOH in 54 mL of 2-methoxyethanol with adding 996 μL of ethanolamine. Solutions were then further diluted to 65% by adding more 2-methoxyethanol and stirred for at least an hour before spin casting onto indium tin oxide substrate to form the electron transport layer.

The polymer and the acceptor, $PC_{70}BM$, in a ratio of 1:1.2 were dissolved in chlorobenzene at the concentration of 26 mg/mL to obtain the photoactive layer solution. The solution was stirred and heated at 80° C. overnight in a nitrogen filled glove box. The next day 3.0 vol % of 1,8-diiodooctane (DIO) was added before spin-coating of the photoactive layer.

Indium tin oxide patterned glass substrates were cleaned by successive ultra-sonications in acetone and isopropanol. Each 15-min step was repeated twice and the freshly cleaned substrates were left to dry overnight at 60° C. Preceding fabrication, the substrates were further cleaned for 1.5 min in a UV-ozone chamber and the electron transport layer was immediately spin coated on top.

Sol-gel electron transport layer solution was filtered directly onto the indium tin oxide with a 0.25 μm poly(vinylidene fluoride) filter and spin cast at 4000 rpm for 40 s. Films were then annealed at 250° C. for 15 min, and directly transferred into a nitrogen filled glove box.

The photoactive layer was deposited on the electron transport layer via spin coating at 600 rpm for 40 s with the solution and the substrate being preheated at 110° C. and directly transferred into a glass petri dish for overnight solvent annealing.

After annealing, the substrates were loaded into the vacuum evaporator where $MoO_3$ (hole transport layer) and Ag (anode) were sequentially deposited by thermal evaporation. Deposition occurred at a pressure of <$4 \times 10^{-6}$ torr. $MoO_3$ and Ag had thicknesses of 5.0 nm and 120 nm, respectively. Samples were then encapsulated with glass using an epoxy binder and treated with UV light for 3 min.

Synthesis of Polymers

Three different repeat unit B's were used to produce three different polymers.

| Sample | Repeat unit B |
|---|---|
| A | (structure with $C_4H_9$/$C_2H_5$ substituted thiophene-benzodithiophene-thiophene polymer) |
| B | (structure with $C_4H_9$/$C_2H_5$ substituted thiophene-thiophene-benzodithiophene-thiophene-thiophene polymer) |
| C | (structure with $C_{10}H_{21}$/$C_8H_{17}$ substituted quaterthiophene polymer) |

The polymers were prepared from a traditional Stille coupling reaction. The stannylated versions of the samples A, B, and C were copolymerized with

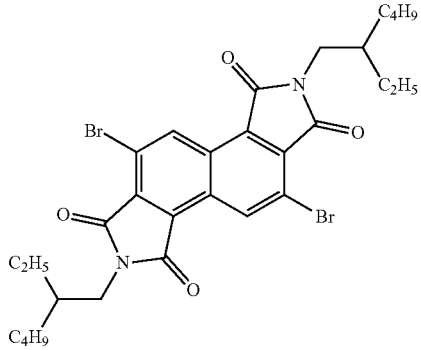

to produce polymers A, B and C.

Polymer A: In a Schlenk flask,

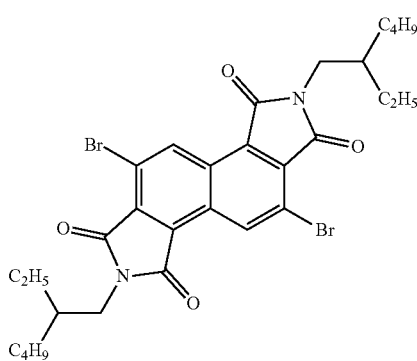

(61.6 mg, 0.095 mmol),

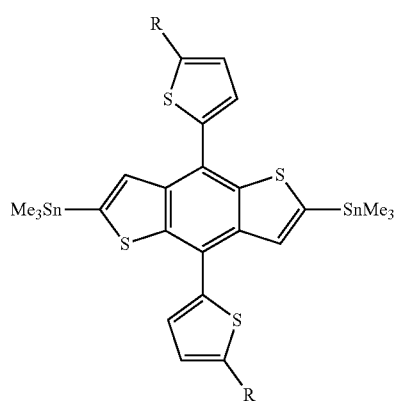

(85.9 mg, 0.095 mmol), and Pd(PPh$_3$)$_4$ (11 mg, 0.009 mmol) were combined, then degassed for 30 minutes. After refilling with argon, toluene (3.8 mL) and DMF (0.95 mL) were added, and the reaction mixture was degassed via three freeze-pump-thaw cycles, using liquid nitrogen to freeze the solution. The solution was then heated to 120° C. and stirred for two days under argon atmosphere. The reaction mixture was cooled to room temperature, poured into methanol (50 mL), and the polymer was collected by filtration. The polymer was purified by Soxhlet extraction, washing sequentially with acetone, hexanes, and chloroform. The polymer,

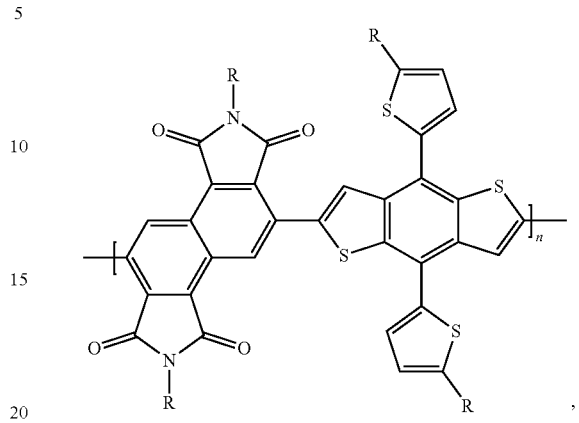

was recovered in the chloroform fraction (76 mg, 73% yield).

Polymer B: In a Schlenk flask,

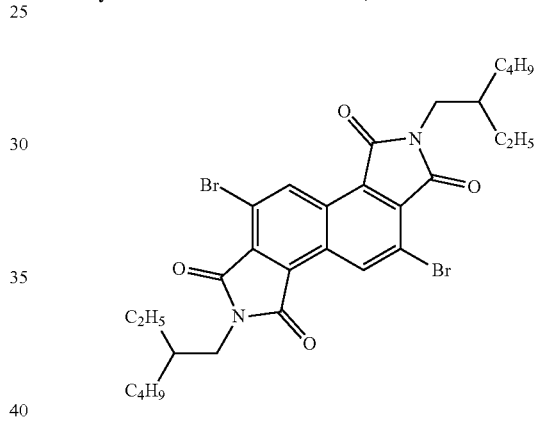

(60 mg, 0.093 mmol),

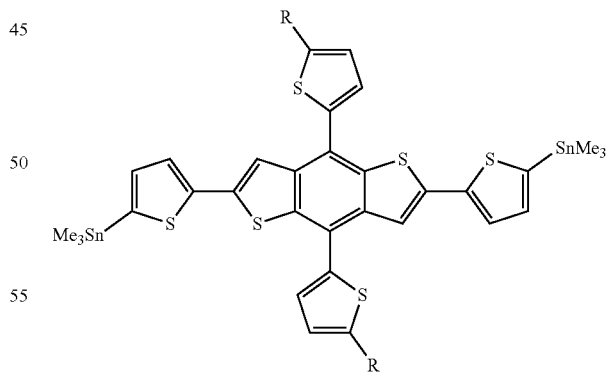

(98.9 mg, 0.093 mmol), and Pd(PPh$_3$)$_4$ (11 mg, 0.009 mmol) were combined, then degassed for 30 minutes. After refilling with argon, toluene (3.6 mL) and DMF (0.9 mL) were added, and the reaction mixture was degassed via three freeze-pump-thaw cycles, using liquid nitrogen to freeze the solution. The solution was then heated to 120° C. and stirred for two days under argon atmosphere. The reaction mixture was cooled to room temperature, poured into methanol (50 mL), and the polymer was collected by filtration. The polymer was purified by Soxhlet extraction, washing sequentially with acetone, hexanes, chloroform, and chlorobenzene. Some of the polymer,

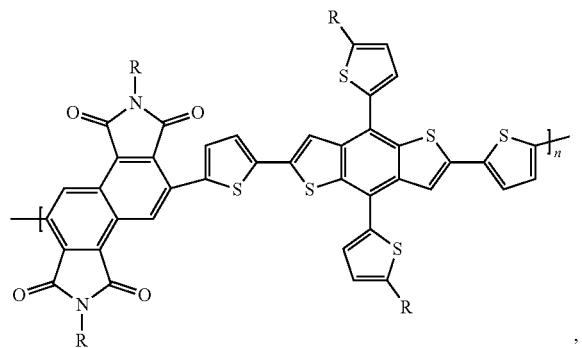

was collected from the chloroform fraction (26 mg, 22% yield), but most of the polymer was not extracted (50 mg, 43% yield).

Polymer C: In a Schlenk flask,

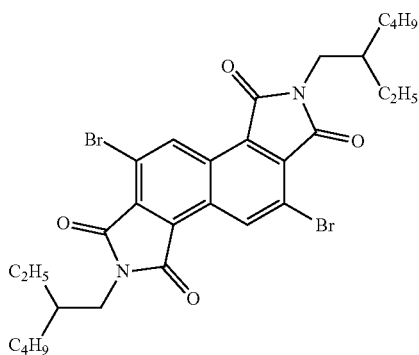

(63.9 mg, 0.099 mmol),

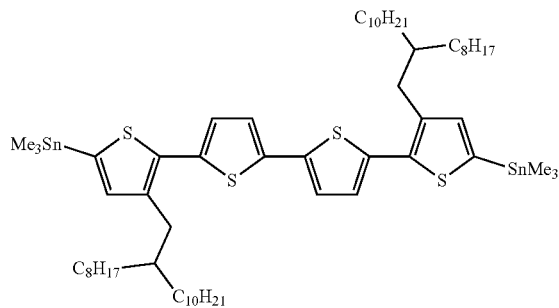

(120 mg, 0.099 mmol), and $Pd_2(dba)_3$ (2.3 mg, 0.003 mmol) were combined, then degassed for 30 minutes. After refilling with argon, chlorobenzene (1.65 mL) was added, and the reaction mixture was degassed via three freeze-pump-thaw cycles, using liquid nitrogen to freeze the solution. The solution was then heated to 120° C. and stirred for two days under argon atmosphere. The reaction mixture was cooled to room temperature, poured into methanol (50 mL), and the polymer was collected by filtration. The polymer was purified by Soxhlet extraction, washing sequentially with acetone, hexanes, chloroform, and chlorobenzene. The polymer,

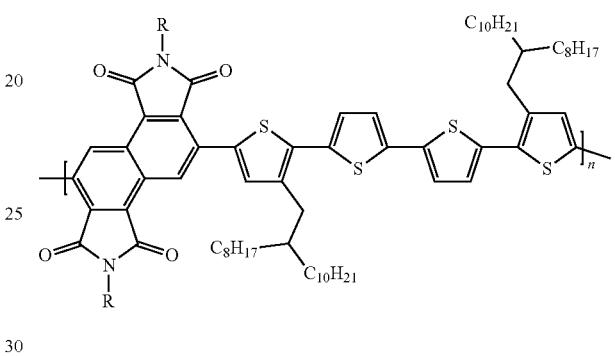

was recovered in the chloroform fraction (101 mg, 73% yield).

UV-Visible Absorption Spectroscopy

Absorption spectroscopy was performed and measured in the wavelength region from 300 to 1000 nm. A blank glass slide background was subtracted from all spectra. The polymer thin film samples were prepared by spin casting a 10 mg/mL solution of polymer (in 50:50 chlorobenzene:dichlorobenzene) onto a glass slide at 1200 rpm. FIG. 9 depicts the UV-Visible absorption spectra of the polymers.

UV-Visible Absorption Spectroscopy Solar Simulator

Devices with an active area of 0.08306 $cm^2$ determined from aperture mask were tested under AM 1.5 G 100 $mW/cm^2$ conditions with a Newport Thermal Oriel 91192 1000 W solar simulator (4"×4" illumination size). FIG. 10 depicts the UV-Visible absorption spectra of the polymers as a result of the solar simulator.

Representative Current Density

Representative current density—voltage characteristics are shown below in Table 1.

TABLE 1

| Sample | Jsc (mA/$cm^2$) | | $V_{oc}$ (V) | | FF (%) | | PCE (%) | | Rs (Ω $cm^2$) | | Rsh (Ω $cm^2$) | |
|---|---|---|---|---|---|---|---|---|---|---|---|---|
| | Avg | Max | Avg | Max | Avg | Max | Avg | Max | Avg | Max | Avg | Max |
| A | 5.11 | 5.4 | 0.673 | 0.723 | 40.2 | 44.8 | 1.4 | 1.5 | 57 | 64 | 527 | 580 |
| C | 7.76 | 8.59 | 0.901 | 0.903 | 66.8 | 72.0 | 4.5 | 4.9 | 8.9 | 15 | 2340 | 3010 |

Jsc (mA/cm$^2$) Short-circuit current density (Jsc) is the current density that flows out of the solar cell at zero bias. $V_{oc}$ (V) Open-circuit voltage ($V_{oc}$) is the voltage for which the current in the external circuit is zero. FF (%) fill factor (FF) is the ratio of the maximum power point divided by the open circuit voltage and the short circuit current. PCE (%) of the power conversion efficiency (PCE) of a photovoltaic cell is the percentage of the solar energy shining on a photovoltaic device that is converted into usable electricity. Rs (Ω cm$^2$) series resistance (Rs) through the photovoltaic cell. Rsh (Ω cm$^2$) parallel resistance though the photovoltaic cell.

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. A copolymer comprising:
   a repeat unit A, wherein repeat unit A comprises

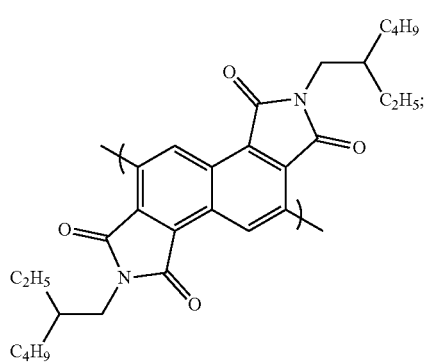

and
   at least one repeat unit B, wherein repeat unit B comprises an aryl group.

2. The copolymer of claim 1, wherein the copolymer is regio-random.

3. The copolymer of claim 1, wherein the copolymer is regio-regular.

4. The copolymer of claim 1, wherein the aryl group is a 3,3'-difluror-2,2'-bithiophene.

5. The copolymer of claim 1, wherein the aryl group is a benzo[1,2-b:4,5-b']dithiophene.

6. The copolymer of claim 1, wherein the aryl group is a

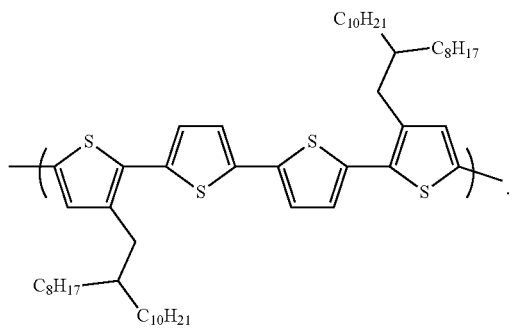

7. The copolymer of claim 1, wherein the aryl group is

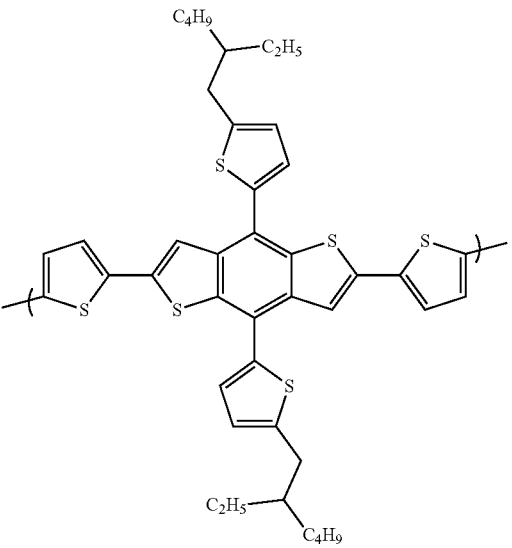

8. The copolymer of claim 1, wherein the method of producing

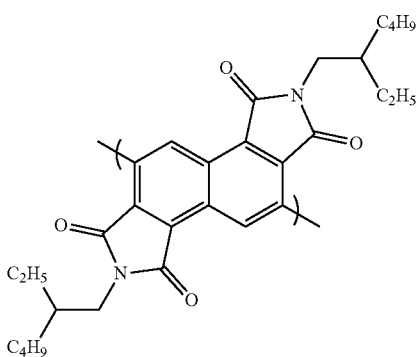

does not contain cyanide.

9. The copolymer of claim 1, wherein the method of producing

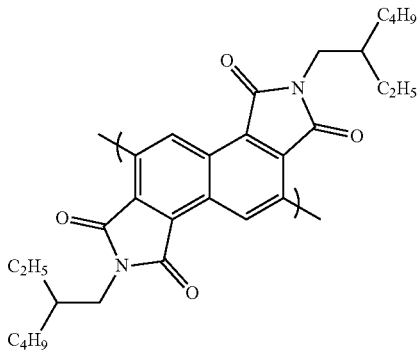

comprises a step of brominating 2,6-naphthalene diol to produce

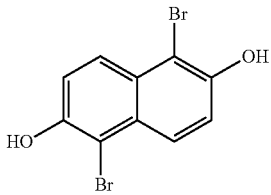

and a step of converting the bromines of

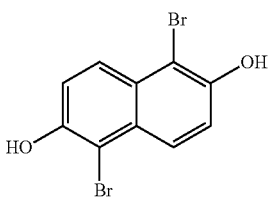

to tetramethylsilane.

10. The copolymer of claim 1, wherein the copolymer is used as a photovoltaic material.

11. The copolymer of claim 1, wherein the copolymer is used as an active layer in an electronic device.

12. The copolymer of claim 1, wherein the number of repeat units A and B range from about 3 to about 10,000.

* * * * *